(12) United States Patent
Liu

(10) Patent No.: US 11,927,475 B2
(45) Date of Patent: Mar. 12, 2024

(54) DETECTING HIGH INTENSITY LIGHT IN PHOTO SENSOR

(71) Applicant: META PLATFORMS TECHNOLOGIES, LLC, Menlo Park, CA (US)

(72) Inventor: Xinqiao Liu, Medina, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/820,594

(22) Filed: Mar. 16, 2020

(65) Prior Publication Data

US 2020/0217714 A1 Jul. 9, 2020

Related U.S. Application Data

(63) Continuation of application No. 15/983,379, filed on May 18, 2018, now Pat. No. 10,598,546.

(Continued)

(51) Int. Cl.
*G01J 1/18* (2006.01)
*G01J 1/02* (2006.01)
(Continued)

(52) U.S. Cl.
CPC .............. *G01J 1/18* (2013.01); *G01J 1/0228* (2013.01); *G01J 1/08* (2013.01); *G01J 1/1626* (2013.01);
(Continued)

(58) Field of Classification Search
CPC .... G01J 1/18; G01J 1/44; G01J 1/4228; G01J 1/10; G01J 2001/446; G01J 2001/448;
(Continued)

(56) References Cited

U.S. PATENT DOCUMENTS 4,596,977 A 6/1986 Bauman et al.
5,053,771 A 10/1991 McDermott
(Continued)

FOREIGN PATENT DOCUMENTS

CN 1490878 A 4/2004
CN 1728397 A 2/2006
(Continued)

OTHER PUBLICATIONS

U.S. Appl. No. 16/436,137, "Non-Final Office Action", dated Dec. 4, 2020, 12 pages.
(Continued)

*Primary Examiner* — Tony Ko
(74) *Attorney, Agent, or Firm* — Kilpatrick Townsend & Stockton LLP

(57) ABSTRACT

In one example, an apparatus comprises: a photodiode configured to generate charge in response to incident light within an exposure period; and a quantizer configured to perform at least one of a first quantization operation to generate a first digital output or a second quantization to generate a second digital output, and output, based on a range of an intensity of the incident light, one of the first digital output or the second digital output to represent the intensity of the incident light. The first quantization operation comprises quantizing at least a first part of the charge during the exposure period to generate the first digital output. The second quantization operation comprises quantizing at least a second part of the charge after the exposure period to generate the second digital output.

20 Claims, 7 Drawing Sheets

Related U.S. Application Data

(60) Provisional application No. 62/546,993, filed on Aug. 17, 2017.

(51) Int. Cl.
  *G01J 1/08* (2006.01)
  *G01J 1/16* (2006.01)
  *G01J 1/42* (2006.01)
  *G01J 1/44* (2006.01)
  *H01L 27/146* (2006.01)
  *H01L 31/0203* (2014.01)
  *H04N 5/357* (2011.01)
  *H04N 5/359* (2011.01)
  *H04N 5/369* (2011.01)
  *H04N 5/3745* (2011.01)
  *H01L 27/32* (2006.01)

(52) U.S. Cl.
  CPC ............ *G01J 1/4228* (2013.01); *G01J 1/44* (2013.01); *H01L 27/14612* (2013.01); *H01L 27/14634* (2013.01); *H01L 27/1464* (2013.01); *H01L 31/0203* (2013.01); *H04N 5/357* (2013.01); *H04N 5/3591* (2013.01); *H04N 5/3594* (2013.01); *H04N 5/37455* (2013.01); *H04N 5/379* (2018.08); *H01L 27/14636* (2013.01); *H01L 27/14643* (2013.01); *H01L 27/3227* (2013.01)

(58) Field of Classification Search
  CPC .......... G01J 1/0228; G01J 1/08; G01J 1/1626; H04N 5/357; H04N 5/3591; H04N 5/3594; H04N 5/379; H04N 5/37455; H01L 27/14636; H01L 27/3227; H01L 27/14643; H01L 27/14612; H01L 27/14634; H01L 27/1464; H01L 31/0203

See application file for complete search history.

(56) References Cited

U.S. PATENT DOCUMENTS

| | | |
|---|---|---|
| 5,650,643 A | 7/1997 | Konuma |
| 5,844,512 A | 12/1998 | Gorin et al. |
| 5,963,369 A | 10/1999 | Steinthal et al. |
| 6,181,822 B1 | 1/2001 | Miller et al. |
| 6,384,905 B1 | 5/2002 | Barrows |
| 6,522,395 B1 | 2/2003 | Bamji et al. |
| 6,529,241 B1 | 3/2003 | Clark |
| 6,864,817 B1 | 3/2005 | Salvi et al. |
| 6,963,369 B1 | 11/2005 | Olding |
| 7,326,903 B2 | 2/2008 | Ackland |
| 7,362,365 B1 | 4/2008 | Reyneri et al. |
| 7,659,772 B2 | 2/2010 | Nomura et al. |
| 7,659,925 B2 | 2/2010 | Krymski |
| 7,719,589 B2 | 5/2010 | Turchetta et al. |
| 7,880,779 B2 | 2/2011 | Storm |
| 7,956,914 B2 | 6/2011 | Xu |
| 8,134,623 B2 | 3/2012 | Purcell et al. |
| 8,144,227 B2 | 3/2012 | Kobayashi |
| 8,369,458 B2 | 2/2013 | Wong et al. |
| 8,426,793 B1 | 4/2013 | Barrows |
| 8,754,798 B2 | 6/2014 | Lin |
| 8,773,562 B1 | 7/2014 | Fan |
| 8,779,346 B2 | 7/2014 | Fowler et al. |
| 8,946,610 B2 | 2/2015 | Iwabuchi et al. |
| 9,001,251 B2 | 4/2015 | Smith et al. |
| 9,094,629 B2 | 7/2015 | Ishibashi |
| 9,185,273 B2 | 11/2015 | Beck et al. |
| 9,274,151 B2 | 3/2016 | Lee et al. |
| 9,282,264 B2 | 3/2016 | Park et al. |
| 9,332,200 B1 | 5/2016 | Hseih et al. |
| 9,343,497 B2 | 5/2016 | Cho |
| 9,363,454 B2 | 6/2016 | Ito et al. |
| 9,478,579 B2 | 10/2016 | Dai et al. |
| 9,497,396 B2 | 11/2016 | Choi |
| 9,531,990 B1 | 12/2016 | Wilkins et al. |
| 9,800,260 B1 | 10/2017 | Banerjee |
| 9,819,885 B2 * | 11/2017 | Furukawa .......... H04N 5/37455 |
| 9,832,370 B2 | 11/2017 | Cho et al. |
| 9,909,922 B2 | 3/2018 | Schweickert et al. |
| 9,948,316 B1 | 4/2018 | Yun et al. |
| 9,955,091 B1 | 4/2018 | Dai et al. |
| 9,967,496 B2 | 5/2018 | Ayers et al. |
| 10,003,759 B2 | 6/2018 | Fan |
| 10,015,416 B2 | 7/2018 | Borthakur et al. |
| 10,090,342 B1 | 10/2018 | Gambino et al. |
| 10,096,631 B2 | 10/2018 | Ishizu |
| 10,154,221 B2 | 12/2018 | Ogino et al. |
| 10,157,951 B2 | 12/2018 | Kim et al. |
| 10,321,081 B2 | 6/2019 | Watanabe et al. |
| 10,345,447 B1 | 7/2019 | Hicks |
| 10,419,701 B2 | 9/2019 | Liu |
| 10,574,925 B2 | 2/2020 | Otaka |
| 10,594,974 B2 | 3/2020 | Ivarsson et al. |
| 10,598,546 B2 | 3/2020 | Liu |
| 10,608,101 B2 | 3/2020 | Liu |
| 10,686,996 B2 | 6/2020 | Liu |
| 10,726,627 B2 | 7/2020 | Liu |
| 10,750,097 B2 | 8/2020 | Liu |
| 10,764,526 B1 | 9/2020 | Liu et al. |
| 10,804,926 B2 | 10/2020 | Gao et al. |
| 10,812,742 B2 | 10/2020 | Chen et al. |
| 10,825,854 B2 | 11/2020 | Liu |
| 10,834,344 B2 | 11/2020 | Chen et al. |
| 10,897,586 B2 | 1/2021 | Liu et al. |
| 10,903,260 B2 | 1/2021 | Chen et al. |
| 10,917,589 B2 | 2/2021 | Liu |
| 10,951,849 B2 | 3/2021 | Liu |
| 10,969,273 B2 | 4/2021 | Berkovich et al. |
| 11,004,881 B2 | 5/2021 | Liu et al. |
| 11,057,581 B2 | 7/2021 | Liu |
| 11,089,210 B2 | 8/2021 | Berkovich et al. |
| 11,595,598 B2 | 2/2023 | Liu et al. |
| 11,595,602 B2 | 2/2023 | Gao et al. |
| 11,729,525 B2 | 8/2023 | Liu |
| 2002/0067303 A1 | 6/2002 | Lee et al. |
| 2002/0113886 A1 | 8/2002 | Hynecek |
| 2002/0118289 A1 | 8/2002 | Choi |
| 2003/0001080 A1 | 1/2003 | Kummaraguntla et al. |
| 2003/0020100 A1 | 1/2003 | Guidash |
| 2003/0049925 A1 | 3/2003 | Layman et al. |
| 2004/0095495 A1 | 5/2004 | Inokuma et al. |
| 2004/0118994 A1 | 6/2004 | Mizuno |
| 2004/0251483 A1 | 12/2004 | Ko et al. |
| 2005/0046715 A1 | 3/2005 | Lim et al. |
| 2005/0057389 A1 | 3/2005 | Krymski |
| 2005/0104983 A1 | 5/2005 | Raynor |
| 2005/0206414 A1 | 9/2005 | Cottin et al. |
| 2005/0237380 A1 | 10/2005 | Kakii et al. |
| 2005/0280727 A1 | 12/2005 | Sato et al. |
| 2006/0023109 A1 | 2/2006 | Mabuchi et al. |
| 2006/0146159 A1 | 7/2006 | Farrier |
| 2006/0157759 A1 | 7/2006 | Okita et al. |
| 2006/0158541 A1 | 7/2006 | Ichikawa |
| 2007/0013983 A1 | 1/2007 | Kitamura et al. |
| 2007/0076109 A1 | 4/2007 | Krymski |
| 2007/0076481 A1 | 4/2007 | Tennant |
| 2007/0092244 A1 | 4/2007 | Pertsel et al. |
| 2007/0102740 A1 | 5/2007 | Ellis-Monaghan et al. |
| 2007/0131991 A1 | 6/2007 | Sugawa |
| 2007/0208526 A1 | 9/2007 | Staudt et al. |
| 2007/0222881 A1 | 9/2007 | Mentzer |
| 2008/0001065 A1 | 1/2008 | Ackland |
| 2008/0007731 A1 | 1/2008 | Botchway et al. |
| 2008/0042888 A1 | 2/2008 | Danesh |
| 2008/0068478 A1 | 3/2008 | Watanabe |
| 2008/0088014 A1 | 4/2008 | Adkisson et al. |
| 2008/0191791 A1 | 8/2008 | Nomura et al. |
| 2008/0226170 A1 | 9/2008 | Sonoda |
| 2008/0226183 A1 | 9/2008 | Lei et al. |
| 2008/0266434 A1 | 10/2008 | Sugawa et al. |
| 2009/0002528 A1 | 1/2009 | Manabe et al. |

(56) References Cited

U.S. PATENT DOCUMENTS

| | | |
|---|---|---|
| 2009/0033588 A1 | 2/2009 | Kajita et al. |
| 2009/0040364 A1 | 2/2009 | Rubner |
| 2009/0091645 A1 | 4/2009 | Trimeche et al. |
| 2009/0128640 A1 | 5/2009 | Yumiki |
| 2009/0140305 A1 | 6/2009 | Sugawa |
| 2009/0219266 A1 | 9/2009 | Lim et al. |
| 2009/0224139 A1 | 9/2009 | Buettgen et al. |
| 2009/0237536 A1 | 9/2009 | Purcell et al. |
| 2009/0244346 A1 | 10/2009 | Funaki |
| 2009/0245637 A1 | 10/2009 | Barman et al. |
| 2009/0261235 A1 | 10/2009 | Lahav et al. |
| 2009/0321615 A1 | 12/2009 | Sugiyama et al. |
| 2010/0013969 A1 | 1/2010 | Ui |
| 2010/0140732 A1 | 6/2010 | Eminoglu et al. |
| 2010/0194956 A1 | 8/2010 | Yuan et al. |
| 2010/0232227 A1 | 9/2010 | Lee |
| 2010/0276572 A1 | 11/2010 | Iwabuchi et al. |
| 2011/0049589 A1 | 3/2011 | Chuang et al. |
| 2011/0122304 A1 | 5/2011 | Sedelnikov |
| 2011/0149116 A1 | 6/2011 | Kim |
| 2011/0155892 A1 | 6/2011 | Neter et al. |
| 2011/0254986 A1 | 10/2011 | Nishimura et al. |
| 2012/0016817 A1 | 1/2012 | Smith et al. |
| 2012/0039548 A1 | 2/2012 | Wang et al. |
| 2012/0068051 A1 | 3/2012 | Ahn et al. |
| 2012/0092677 A1 | 4/2012 | Suehira et al. |
| 2012/0105475 A1 | 5/2012 | Tseng |
| 2012/0105668 A1 | 5/2012 | Velarde et al. |
| 2012/0113119 A1 | 5/2012 | Massie |
| 2012/0127284 A1 | 5/2012 | Bar-Zeev et al. |
| 2012/0133807 A1 | 5/2012 | Wu et al. |
| 2012/0138775 A1 | 6/2012 | Cheon et al. |
| 2012/0153123 A1 | 6/2012 | Mao et al. |
| 2012/0188420 A1 | 7/2012 | Black et al. |
| 2012/0200499 A1 | 8/2012 | Osterhout et al. |
| 2012/0205520 A1 | 8/2012 | Hsieh et al. |
| 2012/0212465 A1 | 8/2012 | White et al. |
| 2012/0241591 A1 | 9/2012 | Wan et al. |
| 2012/0262616 A1 | 10/2012 | Sa et al. |
| 2012/0267511 A1 | 10/2012 | Kozlowski |
| 2012/0273654 A1 | 11/2012 | Hynecek et al. |
| 2012/0305751 A1 | 12/2012 | Kusuda |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0068929 A1 | 3/2013 | Solhusvik et al. |
| 2013/0069787 A1 | 3/2013 | Petrou |
| 2013/0082313 A1 | 4/2013 | Manabe |
| 2013/0113969 A1 | 5/2013 | Manabe et al. |
| 2013/0126710 A1 | 5/2013 | Kondo |
| 2013/0141619 A1 | 6/2013 | Lim et al. |
| 2013/0187027 A1 | 7/2013 | Qiao et al. |
| 2013/0207219 A1 | 8/2013 | Ahn |
| 2013/0214127 A1 | 8/2013 | Ohya et al. |
| 2013/0214371 A1 | 8/2013 | Asatsuma et al. |
| 2013/0218728 A1 | 8/2013 | Hashop et al. |
| 2013/0221194 A1 | 8/2013 | Manabe |
| 2013/0229543 A1 | 9/2013 | Hashimoto et al. |
| 2013/0229560 A1 | 9/2013 | Kondo |
| 2013/0234029 A1 | 9/2013 | Bikumandla |
| 2013/0293752 A1 | 11/2013 | Peng et al. |
| 2013/0299674 A1 | 11/2013 | Fowler et al. |
| 2014/0021574 A1 | 1/2014 | Egawa |
| 2014/0042299 A1 | 2/2014 | Wan et al. |
| 2014/0042582 A1 | 2/2014 | Kondo |
| 2014/0070974 A1 | 3/2014 | Park et al. |
| 2014/0078336 A1 | 3/2014 | Beck et al. |
| 2014/0085523 A1 | 3/2014 | Hynecek |
| 2014/0176770 A1 | 6/2014 | Kondo |
| 2014/0211052 A1 | 7/2014 | Choi |
| 2014/0232890 A1 | 8/2014 | Yoo et al. |
| 2014/0247382 A1 | 9/2014 | Moldovan et al. |
| 2014/0306276 A1 | 10/2014 | Yamaguchi |
| 2014/0368687 A1 | 12/2014 | Yu et al. |
| 2015/0070544 A1 | 3/2015 | Smith et al. |
| 2015/0077611 A1 | 3/2015 | Yamashita et al. |
| 2015/0083895 A1 | 3/2015 | Hashimoto et al. |
| 2015/0085134 A1 | 3/2015 | Novotny et al. |
| 2015/0090863 A1 | 4/2015 | Mansoorian et al. |
| 2015/0172574 A1 | 6/2015 | Honda et al. |
| 2015/0179696 A1 | 6/2015 | Kurokawa et al. |
| 2015/0189209 A1 | 7/2015 | Yang et al. |
| 2015/0201142 A1 | 7/2015 | Smith et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0281613 A1 | 10/2015 | Vogelsang et al. |
| 2015/0287766 A1 | 10/2015 | Kim et al. |
| 2015/0309311 A1 | 10/2015 | Cho |
| 2015/0309316 A1 | 10/2015 | Osterhout et al. |
| 2015/0312461 A1 | 10/2015 | Kim et al. |
| 2015/0312502 A1 | 10/2015 | Borremans |
| 2015/0312557 A1 | 10/2015 | Kim |
| 2015/0350582 A1 | 12/2015 | Korobov et al. |
| 2015/0358569 A1 | 12/2015 | Egawa |
| 2015/0358571 A1 | 12/2015 | Dominguez Castro et al. |
| 2015/0358593 A1 | 12/2015 | Sato |
| 2015/0381907 A1 | 12/2015 | Boettiger et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0028974 A1 | 1/2016 | Guidash et al. |
| 2016/0028980 A1 | 1/2016 | Kameyama et al. |
| 2016/0037111 A1 | 2/2016 | Dai et al. |
| 2016/0078614 A1 | 3/2016 | Ryu et al. |
| 2016/0088253 A1 | 3/2016 | Tezuka |
| 2016/0100113 A1 | 4/2016 | Oh et al. |
| 2016/0100115 A1 | 4/2016 | Kusano |
| 2016/0111457 A1 | 4/2016 | Sekine |
| 2016/0112626 A1 | 4/2016 | Shimada |
| 2016/0118992 A1 | 4/2016 | Milkov |
| 2016/0165160 A1 | 6/2016 | Hseih et al. |
| 2016/0197117 A1 | 7/2016 | Nakata et al. |
| 2016/0204150 A1 | 7/2016 | Oh et al. |
| 2016/0210785 A1 | 7/2016 | Balachandreswaran et al. |
| 2016/0240570 A1 | 8/2016 | Barna et al. |
| 2016/0249004 A1 | 8/2016 | Saeki et al. |
| 2016/0255293 A1 | 9/2016 | Gesset |
| 2016/0277010 A1 | 9/2016 | Park et al. |
| 2016/0307945 A1 | 10/2016 | Madurawe |
| 2016/0307949 A1 | 10/2016 | Madurawe |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0039906 A1 | 2/2017 | Jepsen |
| 2017/0041571 A1 | 2/2017 | Tyrrell et al. |
| 2017/0053962 A1 | 2/2017 | Oh et al. |
| 2017/0059399 A1 | 3/2017 | Suh et al. |
| 2017/0062501 A1 | 3/2017 | Velichko et al. |
| 2017/0069363 A1 | 3/2017 | Baker |
| 2017/0070691 A1 | 3/2017 | Nishikido |
| 2017/0099422 A1* | 4/2017 | Goma .................. H04N 5/355 |
| 2017/0099446 A1 | 4/2017 | Cremers et al. |
| 2017/0104021 A1 | 4/2017 | Park et al. |
| 2017/0104946 A1 | 4/2017 | Hong |
| 2017/0111600 A1 | 4/2017 | Wang et al. |
| 2017/0141147 A1 | 5/2017 | Raynor |
| 2017/0154909 A1 | 6/2017 | Ishizu |
| 2017/0170223 A1 | 6/2017 | Hynecek et al. |
| 2017/0195602 A1 | 7/2017 | Iwabuchi et al. |
| 2017/0201693 A1 | 7/2017 | Sugizaki et al. |
| 2017/0207268 A1 | 7/2017 | Kurokawa |
| 2017/0228345 A1 | 8/2017 | Gupta et al. |
| 2017/0251151 A1 | 8/2017 | Hicks |
| 2017/0270664 A1 | 9/2017 | Hoogi et al. |
| 2017/0272667 A1 | 9/2017 | Hynecek |
| 2017/0272768 A1 | 9/2017 | Tall et al. |
| 2017/0280031 A1 | 9/2017 | Price et al. |
| 2017/0293799 A1 | 10/2017 | Skogo et al. |
| 2017/0310910 A1 | 10/2017 | Smith et al. |
| 2017/0318250 A1 | 11/2017 | Sakakibara et al. |

(56) References Cited

U.S. PATENT DOCUMENTS

| | | |
|---|---|---|
| 2017/0324917 A1 | 11/2017 | Mlinar et al. |
| 2017/0338262 A1 | 11/2017 | Hirata |
| 2017/0339327 A1 | 11/2017 | Koshkin et al. |
| 2017/0346579 A1 | 11/2017 | Barghi |
| 2017/0350755 A1 | 12/2017 | Geurts |
| 2017/0359497 A1 | 12/2017 | Mandelli et al. |
| 2017/0366766 A1 | 12/2017 | Geurts et al. |
| 2018/0019269 A1 | 1/2018 | Klipstein |
| 2018/0077368 A1 | 3/2018 | Suzuki |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0152650 A1 | 5/2018 | Sakakibara et al. |
| 2018/0167575 A1 | 6/2018 | Watanabe et al. |
| 2018/0175083 A1 | 6/2018 | Takahashi |
| 2018/0176545 A1 | 6/2018 | Aflaki Beni |
| 2018/0204867 A1 | 7/2018 | Kim et al. |
| 2018/0220093 A1 | 8/2018 | Murao et al. |
| 2018/0224658 A1 | 8/2018 | Teller |
| 2018/0227516 A1 | 8/2018 | Mo et al. |
| 2018/0241953 A1 | 8/2018 | Johnson |
| 2018/0270436 A1 | 9/2018 | Ivarsson et al. |
| 2018/0276841 A1 | 9/2018 | Krishnaswamy et al. |
| 2018/0376046 A1 | 12/2018 | Liu |
| 2018/0376090 A1 | 12/2018 | Liu |
| 2019/0035154 A1 | 1/2019 | Liu |
| 2019/0046044 A1 | 2/2019 | Tzvieli et al. |
| 2019/0052788 A1 | 2/2019 | Liu |
| 2019/0052821 A1 | 2/2019 | Berner et al. |
| 2019/0056264 A1 | 2/2019 | Liu |
| 2019/0057995 A1 | 2/2019 | Liu |
| 2019/0058058 A1 | 2/2019 | Liu |
| 2019/0098232 A1 | 3/2019 | Mori et al. |
| 2019/0104263 A1 | 4/2019 | Ochiai et al. |
| 2019/0104265 A1 | 4/2019 | Totsuka et al. |
| 2019/0110039 A1 | 4/2019 | Linde et al. |
| 2019/0123088 A1 | 4/2019 | Kwon |
| 2019/0141270 A1 | 5/2019 | Otaka et al. |
| 2019/0149751 A1 | 5/2019 | Wise |
| 2019/0157330 A1 | 5/2019 | Sato et al. |
| 2019/0172227 A1 | 6/2019 | Kasahara |
| 2019/0172868 A1 | 6/2019 | Chen et al. |
| 2019/0191116 A1 | 6/2019 | Madurawe |
| 2019/0246036 A1 | 8/2019 | Wu et al. |
| 2019/0253650 A1 | 8/2019 | Kim |
| 2019/0327439 A1 | 10/2019 | Chen et al. |
| 2019/0331914 A1 | 10/2019 | Lee et al. |
| 2019/0335151 A1 | 10/2019 | Rivard et al. |
| 2019/0348460 A1 | 11/2019 | Chen et al. |
| 2019/0355782 A1 | 11/2019 | Do et al. |
| 2019/0363118 A1 | 11/2019 | Berkovich et al. |
| 2019/0371845 A1 | 12/2019 | Chen et al. |
| 2019/0376845 A1 | 12/2019 | Liu et al. |
| 2019/0379388 A1 | 12/2019 | Gao et al. |
| 2019/0379827 A1 | 12/2019 | Berkovich et al. |
| 2019/0379846 A1 | 12/2019 | Chen et al. |
| 2020/0007800 A1 | 1/2020 | Berkovich et al. |
| 2020/0053299 A1 | 2/2020 | Zhang et al. |
| 2020/0059589 A1 | 2/2020 | Liu et al. |
| 2020/0068189 A1 | 2/2020 | Chen et al. |
| 2020/0186731 A1 | 6/2020 | Chen et al. |
| 2020/0195875 A1 | 6/2020 | Berkovich et al. |
| 2020/0217714 A1 | 7/2020 | Liu |
| 2020/0228745 A1 | 7/2020 | Otaka |
| 2020/0374475 A1 | 11/2020 | Fukuoka et al. |
| 2021/0026796 A1 | 1/2021 | Graif et al. |
| 2021/0099659 A1 | 4/2021 | Miyauchi et al. |
| 2021/0185264 A1 | 6/2021 | Wong et al. |
| 2021/0227159 A1 | 7/2021 | Sambonsugi |
| 2021/0368124 A1 | 11/2021 | Berkovich et al. |
| 2023/0080288 A1 | 3/2023 | Berkovich et al. |
| 2023/0092325 A1 | 3/2023 | Tsai et al. |
| 2023/0239582 A1 | 7/2023 | Berkovich et al. |

FOREIGN PATENT DOCUMENTS

| | | |
|---|---|---|
| CN | 1812506 A | 8/2006 |
| CN | 101753866 A | 6/2010 |
| CN | 103002228 A | 3/2013 |
| CN | 103207716 A | 7/2013 |
| CN | 104125418 A | 10/2014 |
| CN | 104204904 A | 12/2014 |
| CN | 104469195 A | 3/2015 |
| CN | 104704812 A | 6/2015 |
| CN | 104733485 A | 6/2015 |
| CN | 104754255 A | 7/2015 |
| CN | 204633945 U | 9/2015 |
| CN | 105144699 A | 12/2015 |
| CN | 105529342 A | 4/2016 |
| CN | 105706439 A | 6/2016 |
| CN | 205666884 U | 10/2016 |
| CN | 106255978 A | 12/2016 |
| CN | 106791504 A | 5/2017 |
| CN | 107852473 A | 3/2018 |
| CN | 109298528 A | 2/2019 |
| DE | 202016105510 | 10/2016 |
| EP | 0675345 | 10/1995 |
| EP | 1681856 A2 | 7/2006 |
| EP | 1732134 | 12/2006 |
| EP | 1746820 | 1/2007 |
| EP | 1788802 A1 | 5/2007 |
| EP | 2037505 A1 | 3/2009 |
| EP | 2063630 | 5/2009 |
| EP | 2538664 | 12/2012 |
| EP | 2804074 A2 | 11/2014 |
| EP | 2833619 | 2/2015 |
| EP | 3032822 | 6/2016 |
| EP | 3229457 A1 | 10/2017 |
| EP | 3258683 | 12/2017 |
| EP | 3425352 | 1/2019 |
| EP | 3439039 A1 | 2/2019 |
| EP | 3744085 A2 | 12/2020 |
| JP | H08195906 A | 7/1996 |
| JP | 2001208101 A | 1/2001 |
| JP | 2002199292 A | 7/2002 |
| JP | 2003319262 A | 11/2003 |
| JP | 2005328493 A | 11/2005 |
| JP | 2006197382 A | 7/2006 |
| JP | 2006203736 A | 8/2006 |
| JP | 2007074447 A | 3/2007 |
| JP | 2011216966 A | 10/2011 |
| JP | 2012054495 A | 3/2012 |
| JP | 2012054876 A | 3/2012 |
| JP | 2012095349 A | 5/2012 |
| JP | 2013009087 A | 1/2013 |
| JP | 2013055581 A | 3/2013 |
| JP | 2013172203 A | 9/2013 |
| JP | 2013225774 A | 10/2013 |
| JP | 2014107596 A | 6/2014 |
| JP | 2014165733 A | 9/2014 |
| JP | 2014236183 A | 12/2014 |
| JP | 2015065524 A | 4/2015 |
| JP | 2015126043 A | 7/2015 |
| JP | 2015530855 A | 10/2015 |
| JP | 2015211259 A | 11/2015 |
| JP | 2016092661 A | 5/2016 |
| JP | 2016513942 A | 5/2016 |
| JP | 2017509251 A | 3/2017 |
| KR | 100574959 B1 | 4/2006 |
| KR | 20080019652 A | 3/2008 |
| KR | 20090023549 A | 3/2009 |
| KR | 20110050351 | 5/2011 |
| KR | 20110134941 A | 12/2011 |
| KR | 20120058337 A | 6/2012 |
| KR | 20120117953 A | 10/2012 |
| KR | 20150085841 A | 8/2015 |
| KR | 20160008267 A | 1/2016 |
| KR | 20160008287 A | 1/2016 |
| TW | 201448184 A | 12/2014 |
| TW | 201719874 A | 6/2017 |
| TW | 201728161 A | 8/2017 |
| TW | 624694 B | 5/2018 |
| WO | 2006124592 A2 | 11/2006 |

(56) References Cited

FOREIGN PATENT DOCUMENTS

| WO | 2006129762 A1 | 12/2006 |
|---|---|---|
| WO | 2010117462 A1 | 10/2010 |
| WO | 2013099723 A1 | 7/2013 |
| WO | WO-2014055391 A2 | 4/2014 |
| WO | 2014144391 A1 | 9/2014 |
| WO | 2015135836 A1 | 9/2015 |
| WO | 2015182390 A1 | 12/2015 |
| WO | 2016014860 A1 | 1/2016 |
| WO | WO-2016095057 A1 | 6/2016 |
| WO | 2016194653 A1 | 12/2016 |
| WO | WO-2017003477 A1 | 1/2017 |
| WO | WO-2017013806 A1 | 1/2017 |
| WO | WO-2017047010 A1 | 3/2017 |
| WO | 2017058488 | 4/2017 |
| WO | 2017069706 | 4/2017 |
| WO | 2017169882 | 10/2017 |
| WO | WO-2017169446 A1 | 10/2017 |
| WO | WO-2019018084 A1 | 1/2019 |
| WO | WO-2019111528 A1 | 6/2019 |
| WO | WO-2019145578 A1 | 8/2019 |
| WO | 2019168929 | 9/2019 |

OTHER PUBLICATIONS

U.S. Appl. No. 16/566,583, "Corrected Notice of Allowability", dated Dec. 11, 2020, 2 pages.
U.S. Appl. No. 15/983,379, "Notice of Allowance", dated Oct. 18, 2019, 9 pages.
European Application No. EP18189100.3, "Extended European Search Report", dated Oct. 9, 2018, 9 pages.
International Search Report and Written Opinion—PCT/US2018/046131—ISA/KR—dated Dec. 3, 2018, 12 pages.
Xu, et al., "A New Digital-Pixel Architecture for CMOS Image Sensor With Pixel-Level ADC and Pulse Width Modulation using A 0.18 Mu M CMOS Technology", IEEE Conference on Electron Devices and Solid-State Circuits, Dec. 16-18, 2003, pp. 365-368.
U.S. Appl. No. 15/668,241, Advisory Action, dated Oct. 23, 2019, 5 pages.
U.S. Appl. No. 15/668,241, Final Office Action, dated Jun. 17, 2019, 19 pages.
U.S. Appl. No. 15/668,241, Non-Final Office Action, dated Dec. 21, 2018, 3 pages.
U.S. Appl. No. 15/668,241, Notice of Allowance, dated Jun. 29, 2020, 8 pages.
U.S. Appl. No. 15/668,241, Notice of Allowance, dated Mar. 5, 2020, 8 pages.
U.S. Appl. No. 15/668,241, "Supplemental Notice of Allowability", dated Apr. 29, 2020, 5 pages.
U.S. Appl. No. 15/719,345, Final Office Action, dated Apr. 29, 2020, 14 pages.
U.S. Appl. No. 15/719,345, Non- Final Office Action, dated Nov. 25, 2019, 14 pages.
U.S. Appl. No. 15/719,345, Notice of Allowance, dated Aug. 12, 2020, 11 pages.
U.S. Appl. No. 15/801,216, Advisory Action, dated Apr. 7, 2020, 3 pages.
U.S. Appl. No. 15/801,216, Final Office Action, dated Dec. 26, 2019, 5 pages.
U.S. Appl. No. 15/801,216, Non-Final Office Action, dated Jun. 27, 2019, 13 pages.
U.S. Appl. No. 15/801,216, Notice of Allowance, dated Jun. 23, 2020, 5 pages.
U.S. Appl. No. 15/847,517, Non-Final Office Action, dated Nov. 23, 2018, 21 pages.
U.S. Appl. No. 15/847,517, Notice of Allowance, dated May 1, 2019, 11 pages.
U.S. Appl. No. 15/861,588, Non-Final Office Action, dated Jul. 10, 2019, 11 pages.
U.S. Appl. No. 15/861,588, Notice of Allowance, dated Nov. 26, 2019, 9 pages.
U.S. Appl. No. 15/876,061, "Corrected Notice of Allowability", dated Apr. 28, 2020, 3 pages.
U.S. Appl. No. 15/876,061, Non-Final Office Action, dated Sep. 18, 2019, 23 pages.
U.S. Appl. No. 15/876,061, "Notice of Allowability", dated May 6, 2020, 2 pages.
U.S. Appl. No. 15/876,061, Notice of Allowance, dated Feb. 4, 2020, 13 pages.
U.S. Appl. No. 15/927,896, Non-Final Office Action, dated May 1, 2019, 10 pages.
U.S. Appl. No. 15/983,391, Non-Final Office Action, dated Aug. 29, 2019, 12 pages.
U.S. Appl. No. 15/983,391, Notice of Allowance, dated Apr. 8, 2020, 8 pages.
U.S. Appl. No. 16/177,971, Final Office Action, dated Feb. 27, 2020, 9 pages.
U.S. Appl. No. 16/177,971, Non-Final Office Action, dated Sep. 25, 2019, 9 pages.
U.S. Appl. No. 16/177,971, Notice of Allowance, dated Apr. 24, 2020, 6 pages.
U.S. Appl. No. 16/210,748, Final Office Action, dated Jul. 7, 2020, 11 pages.
U.S. Appl. No. 16/210,748, Non-Final Office Action, dated Jan. 31, 2020, 11 pages.
U.S. Appl. No. 16/249,420, Non-Final Office Action, dated Jul. 22, 2020, 9 pages.
U.S. Appl. No. 16/286,355, Non-Final Office Action, dated Oct. 1, 2019, 6 pages.
U.S. Appl. No. 16/286,355, Notice of Allowance, dated Feb. 12, 2020, 7 pages.
U.S. Appl. No. 16/286,355, Notice of Allowance, dated Jun. 4, 2020, 7 pages.
U.S. Appl. No. 16/369,763, Non-Final Office Action, dated Jul. 22, 2020, 15 pages.
U.S. Appl. No. 16/382,015, Notice of Allowance, dated Jun. 11, 2020, 11 pages.
U.S. Appl. No. 16/384,720, Non-Final Office Action, dated May 1, 2020, 6 pages.
U.S. Appl. No. 16/431,693, Non-Final Office Action, dated Jan. 30, 2020, 6 pages.
U.S. Appl. No. 16/431,693, Notice of Allowance, dated Jun. 24, 2020, 7 pages.
U.S. Appl. No. 16/435,449, Notice of Allowance, dated Jul. 27, 2020, 8 pages.
U.S. Appl. No. 16/436,049, Non-Final Office Action, dated Jun. 30, 2020, 11 pages.
U.S. Appl. No. 16/436,049, Non-Final Office Action, dated Mar. 4, 2020, 9 pages.
U.S. Appl. No. 16/454,787, Notice of Allowance, dated Apr. 22, 2020, 10 pages.
U.S. Appl. No. 16/454,787, Notice of Allowance, dated Jul. 9, 2020, 9 pages.
U.S. Appl. No. 16/566,583, Final Office Action, dated Apr. 15, 2020, 24 pages.
U.S. Appl. No. 16/566,583, Non-Final Office Action, dated Oct. 1, 2019, 10 pages.
U.S. Appl. No. 16/566,583, Non-Final Office Action, dated Jul. 27, 2020, 11 pages.
Cho et al., "A Low Power Dual CDS for a Column-Parallel CMOS Image Sensor", Journal of Semiconductor Technology and Science, vol. 12, No. 4, Dec. 30, 2012, pp. 388-396.
Application No. EP18179838.0, Extended European Search Report, dated May 24, 2019, 17 pages.
EP18179838.0, "Partial European Search Report", dated Dec. 5, 2018, 14 pages.
Application No. EP18179846.3, Extended European Search Report, dated Dec. 7, 2018, 10 pages.
Application No. EP18179851.3, Extended European Search Report, dated Dec. 7, 2018, 8 pages.
Application No. EP18188684.7, Extended European Search Report, dated Jan. 16, 2019, 10 pages.
Application No. EP18188684.7, Office Action, dated Nov. 26, 2019, 9 pages.

(56) References Cited

OTHER PUBLICATIONS

Application No. EP18188962.7, Extended European Search Report, dated Oct. 23, 2018, 8 pages.
Application No. EP18188962.7, Office Action, dated Aug. 28, 2019, 6 pages.
Application No. EP18188968.4, Extended European Search Report, dated Oct. 23, 2018, 8 pages.
Application No. EP18188968.4, Office Action, dated Aug. 14, 2019, 5 pages.
Kavusi et al., "Quantitative Study of High-Dynamic-Range Image Sensor Architectures", Proceedings of Society of Photo-Optical Instrumentation Engineers—The International Society for Optical Engineering, vol. 5301, Jun. 2004, pp. 264-275.
Application No. PCT/US2018/039350, International Preliminary Report on Patentability, dated Jan. 9, 2020, 10 pages.
Application No. PCT/US2018/039350, International Search Report and Written Opinion, dated Nov. 15, 2018, 13 pages.
Application No. PCT/US2018/039352, International Search Report and Written Opinion, dated Oct. 26, 2018, 10 pages.
Application No. PCT/US2018/039431, International Search Report and Written Opinion, dated Nov. 7, 2018, 14 pages.
Application No. PCT/US2018/045661, International Search Report and Written Opinion, dated Nov. 30, 2018, 11 Pages.
Application No. PCT/US2018/045666, International Preliminary Report on Patentability, dated Feb. 27, 2020, 11 pages.
Application No. PCT/US2018/045666, International Search Report and Written Opinion, dated Dec. 3, 2018, 13 pages.
Application No. PCT/US2018/045673, International Search Report and Written Opinion, dated Dec. 4, 2018, 13 pages.
Application No. PCT/US2018/064181, International Preliminary Report on Patentability, dated Jun. 18, 2020, 9 pages.
Application No. PCT/US2018/064181, International Search Report and Written Opinion, dated Mar. 29, 2019, 12 pages.
Application No. PCT/US2019/014044, International Search Report and Written Opinion, dated May 8, 2019, 11 pages.
Application No. PCT/US2019/019756, International Search Report and Written Opinion, dated Jun. 13, 2019, 11 pages.
Application No. PCT/US2019/025170, International Search Report and Written Opinion, dated Jul. 9, 2019, 11 pages.
Application No. PCT/US2019/027727, International Search Report and Written Opinion, dated Jun. 27, 2019, 11 pages.
Application No. PCT/US2019/027729, International Search Report and Written Opinion, dated Jun. 27, 2019, 10 pages.
Application No. PCT/US2019/031521, International Search Report and Written Opinion, dated Jul. 11, 2019, 11 pages.
Application No. PCT/US2019/035724, International Search Report and Written Opinion, dated Sep. 10, 2019, 12 pages.
Application No. PCT/US2019/036484, International Search Report and Written Opinion, dated Sep. 19, 2019, 10 pages.
Application No. PCT/US2019/036492, International Search Report and Written Opinion, dated Sep. 25, 2019, 9 pages.
Application No. PCT/US2019/036536, International Search Report and Written Opinion, dated Sep. 26, 2019, 14 pages.
Application No. PCT/US2019/036575, International Search Report and Written Opinion, dated Sep. 30, 2019, 16 pages.
Application No. PCT/US2019/039410, International Search Report and Written Opinion, dated Sep. 30, 2019, 11 pages.
Application No. PCT/US2019/039758, International Search Report and Written Opinion, dated Oct. 11, 2019, 13 pages.
Application No. PCT/US2019/047156, International Search Report and Written Opinion, dated Oct. 23, 2019, 9 pages.
Application No. PCT/US2019/048241, International Search Report and Written Opinion, dated Jan. 28, 2020, 16 pages.
Application No. PCT/US2019/049756, International Search Report and Written Opinion, dated Dec. 16, 2019, 8 pages.
Application No. PCT/US2019/059754, International Search Report and Written Opinion, dated Mar. 24, 2020, 15 pages.
Application No. PCT/US2019/065430, International Search Report and Written Opinion, dated Mar. 6, 2020, 15 pages.

Snoeij, "A Low Power Column-Parallel 12-Bit ADC for CMOS Imagers", Institute of Electrical and Electronics Engineers Workshop on Charge-Coupled Devices And Advanced Image Sensors, Jun. 2005, pp. 169-172.
Tanner et al., "Low-Power Digital Image Sensor for Still Picture Image Acquisition", Visual Communications and Image Processing, vol. 4306, May 2001, 8 pages.
U.S. Appl. No. 15/719,345, "Notice of Allowance", dated Sep. 3, 2020, 12 pages.
U.S. Appl. No. 16/454,787, "Notice of Allowance", dated Sep. 9, 2020, 9 pages.
U.S. Appl. No. 16/707,988, "Non-Final Office Action", dated Sep. 22, 2020, 15 pages.
U.S. Appl. No. 16/435,451, "Non-Final Office Action", dated Feb. 1, 2021, 14 pages.
U.S. Appl. No. 16/566,583, "Corrected Notice of Allowability", dated Feb. 3, 2021, 2 pages.
U.S. Appl. No. 16/896,130, "Non-Final Office Action", dated Mar. 15, 2021, 16 pages.
U.S. Appl. No. 16/707,988, "Notice of Allowance", dated May 5, 2021, 14 pages.
U.S. Appl. No. 17/072,840, "Non-Final Office Action", dated Jun. 8, 2021, 7 pages.
U.S. Appl. No. 17/150,925, "Notice of Allowance", dated Jul. 8, 2021, 10 pages.
European Application No. 19737299.8, Office Action dated Jul. 7, 2021, 5 pages.
U.S. Appl. No. 16/435,451, Final Office Action dated Jul. 12, 2021, 13 pages.
U.S. Appl. No. 16/436,049, Notice of Allowance dated Oct. 21, 2020, 8 pages.
U.S. Appl. No. 16/896,130, Notice of Allowance dated Jul. 13, 2021, 8 pages.
U.S. Appl. No. 16/707,988, Corrected Notice of Allowability dated Jul. 26, 2021, 2 pages.
U.S. Appl. No. 16/899,908, Notice of Allowance dated Sep. 17, 2021, 11 pages.
Taiwan Application No. 107124385, Office Action dated Sep. 30, 2021, 17 pages (8 pages of Original Document and 9 pages of English Translation).
International Search Report and Written Opinion for International Application No. PCT/US2021/054327, dated Feb. 14, 2022, 8 pages.
Corrected Notice of Allowance dated Mar. 7, 2022 for U.S. Appl. No. 17/150,925, filed Jan. 15, 2021, 2 Pages.
Non-Final Office Action dated Mar. 2, 2022 for U.S. Appl. No. 17/127,670, filed Dec. 18, 2020, 18 pages.
Notice of Allowance dated Mar. 2, 2022 for U.S. Appl. No. 16/453,538, filed Jun. 26, 2019, 8 pages.
Notice of Allowance dated Mar. 7, 2022 for U.S. Appl. No. 16/421,441, filed May 23, 2019, 18 pages.
Notice of Allowance dated Mar. 11, 2022 for U.S. Appl. No. 16/716,050, filed Dec. 16, 2019, 13 pages.
Notification of the First Office Action dated Oct. 28, 2021 for Chinese Application No. 2019800218483, filed Jan. 24, 2019, 17 pages.
International Search Report and Written Opinion for International Application No. PCT/US2021/065174 dated Mar. 28, 2022, 10 pages.
Office Action dated Mar. 15, 2022 for Japanese Patent Application No. 2020505830, filed on Aug. 9, 2018, 12 pages.
International Search Report and Written Opinion for International Application No. PCT/US2021/057966, dated Feb. 22, 2022, 15 pages.
Advisory Action dated Oct. 8, 2020 for U.S. Appl. No. 16/210,748, filed Dec. 5, 2018, 4 Pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Chuxi L., et al., "A Memristor-Based Processing-in-Memory Architechture for Deep Convolutional Neural Networks Approxi-

(56) References Cited

OTHER PUBLICATIONS mate Computation," Journal of Computer Research and Development, Jun. 30, 2017, vol. 54 (6), pp. 1367-1380.
Communication Pursuant Article 94(3) dated Dec. 23, 2021 for European Application No. 19744961.4, filed Jun. 28, 2019, 8 pages.
Communication Pursuant Article 94(3) dated Jan. 5, 2022 for European Application No. 19740456.9, filed Jun. 27, 2019, 12 pages.
Corrected Notice of Allowability dated Apr. 9, 2021 for U.S. Appl. No. 16/255,528, filed Jan. 23, 2019, 5 Pages.
Extended European Search Report for European Application No. 19743908.6, dated Sep. 30, 2020, 9 Pages.
Final Office Action dated Dec. 3, 2021 for U.S. Appl. No. 17/072,840, filed Oct. 16, 2020, 23 pages.
Final Office Action dated Oct. 18, 2021 for U.S. Appl. No. 16/716,050, filed Dec. 16, 2019, 18 Pages.
Final Office Action dated Oct. 21, 2021 for U.S. Appl. No. 16/421,441, filed May 23, 2019, 23 Pages.
Final Office Action dated Jan. 27, 2021 for U.S. Appl. No. 16/255,528, filed Jan. 23, 2019, 31 Pages.
Final Office Action dated Jul. 28, 2021 for U.S. Appl. No. 17/083,920, filed Oct. 29, 2020, 19 Pages.
International Search Report and Written Opinion for International Application No. PCT/US2019/014904, dated Aug. 5, 2019, 7 Pages.
International Search Report and Written Opinion for International Application No. PCT/US2019/019765, dated Jun. 14, 2019, 9 Pages.
International Search Report and Written Opinion for International Application No. PCT/US2019/034007, dated Oct. 28, 2019, 18 Pages.
International Search Report and Written Opinion for International Application No. PCT/US2019/066805, dated Mar. 6, 2020, 9 Pages.
International Search Report and Written Opinion for International Application No. PCT/US2019/066831, dated Feb. 27, 2020, 11 Pages.
International Search Report and Written Opinion for International Application No. PCT/US2020/044807, dated Sep. 30, 2020, 12 Pages.
International Search Report and Written Opinion for International Application No. PCT/US2020/058097, dated Feb. 12, 2021, 09 Pages.
International Search Report and Written Opinion for International Application No. PCT/US2020/059636, dated Feb. 11, 2021, 18 Pages.
International Search Report and Written Opinion for International Application No. PCT/US2021/031201, dated Aug. 2, 2021, 13 Pages.
International Search Report and Written Opinion for International Application No. PCT/US2021/033321, dated Sep. 6, 2021, 11 pages.
International Search Report and Written Opinion for International Application No. PCT/US2021/041775, dated Nov. 29, 2021, 14 pages.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action dated Jan. 1, 2021 for U.S. Appl. No. 16/715,792, filed Dec. 16, 2019, 15 Pages.
Non-Final Office Action dated Sep. 2, 2021 for U.S. Appl. No. 16/910,844, filed Jun. 24, 2020, 7 Pages.
Non-Final Office Action dated May 7, 2021 for U.S. Appl. No. 16/421,441, filed May 23, 2019, 17 Pages.
Non-Final Office Action dated Jul. 10, 2020 for U.S. Appl. No. 16/255,528, filed Jan. 23, 2019, 27 Pages.
Non-Final Office Action dated May 14, 2021 for U.S. Appl. No. 16/716,050, filed Dec. 16, 2019, 16 Pages.
Non-Final Office Action dated Apr. 21, 2021 for U.S. Appl. No. 16/453,538, filed Jun. 26, 2019, 16 Pages.
Non-Final Office Action dated Apr. 21, 2021 for U.S. Appl. No. 17/083,920, filed Oct. 29, 2020, 17 Pages.
Non-Final Office Action dated Oct. 21, 2021 for U.S. Appl. No. 17/083,920, filed Oct. 29, 2020, 19 Pages.
Non-Final Office Action dated Jul. 25, 2019 for U.S. Appl. No. 15/909,162, filed Mar. 1, 2018, 20 Pages.
Non-Final Office Action dated Apr. 27, 2021 for U.S. Appl. No. 16/829,249, filed Mar. 25, 2020, 9 Pages.
Notice of Allowance dated Apr. 1, 2021 for U.S. Appl. No. 16/255,528, filed Jan. 23, 2019, 7 Pages.
Notice of Allowance dated Nov. 2, 2021 for U.S. Appl. No. 16/453,538, filed Jun. 26, 2019, 8 Pages.
Notice of Allowance dated Nov. 3, 2020 for U.S. Appl. No. 16/566,583, filed Sep. 10, 2019, 11 Pages.
Notice of Allowance dated Jan. 7, 2022 for U.S. Appl. No. 16/899,908, filed Jun. 12, 2020, 10 pages.
Notice of Allowance dated Dec. 8, 2021 for U.S. Appl. No. 16/829,249, filed Mar. 25, 2020, 6 pages.
Notice of Allowance dated Oct. 14, 2020 for U.S. Appl. No. 16/384,720, filed Apr. 15, 2019, 8 Pages.
Notice of Allowance dated Oct. 15, 2020 for U.S. Application No. 16/544, 136, filed Aug. 19, 2019, 11 Pages.
Notice of Allowance dated Apr. 16, 2021 for U.S. Appl. No. 16/715,792, filed Dec. 16, 2019, 10 Pages.
Notice of Allowance dated Sep. 16, 2020 for U.S. Appl. No. 16/435,449, filed Jun. 7, 2019, 7 Pages.
Notice of Allowance dated Nov. 17, 2021 for U.S. Appl. No. 16/899,908, filed Jun. 12, 2020, 7 Pages.
Notice of Allowance dated Mar. 18, 2020 for U.S. Application No. 15/909, 162, filed Mar. 1, 2018, 9 Pages.
Notice of Allowance dated Nov. 18, 2020 for U.S. Appl. No. 16/249,420, filed Jan. 16, 2019, 8 Pages.
Notice of Allowance dated Dec. 21, 2021 for U.S. Appl. No. 16/550,851, filed Aug. 26, 2019, 10 pages.
Notice of Allowance dated Dec. 22, 2021 for U.S. Appl. No. 16/910,844, filed Jun. 24, 2020, 7 pages.
Notice of Allowance dated Jan. 22, 2021 for U.S. Appl. No. 16/369,763, filed Mar. 29, 2019, 8 Pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Notice of Allowance dated Oct. 25, 2021 for U.S. Appl. No. 16/435,451, filed Jun. 7, 2019, 8 Pages.
Notice of Allowance dated Aug. 26, 2020 for U.S. Appl. No. 16/384,720, filed Apr. 15, 2019, 8 Pages.
Notice of Allowance dated Oct. 26, 2021 for U.S. Appl. No. 16/896,130, filed Jun. 8, 2020, 8 Pages.
Notice of Allowance dated Aug. 30, 2021 for U.S. Appl. No. 16/829,249, filed Mar. 25, 2020, 8 pages.
Notice of Reason for Rejection dated Nov. 16, 2021 for Japanese Application No. 2019-571699, filed Jun. 25, 2018, 13 pages.
Office Action dated Jul. 3, 2020 for Chinese Application No. 201810821296, filed Jul. 24, 2018, 17 Pages.
Office Action dated Jul. 7, 2021 for European Application No. 19723902.3, filed Apr. 1, 2019, 3 Pages.
Office Action dated Mar. 9, 2021 for Chinese Application No. 201810821296, filed Jul. 24, 2018, 10 Pages.
Office Action dated Dec. 14, 2021 for Japanese Application No. 2019571598, filed Jun. 26, 2018, 12 pages.
Office Action dated Jun. 28, 2020 for Chinese Application No. 201810821296, filed Jul. 24, 2018, 2 Pages.
Partial International Search Report and Provisional Opinion for International Application No. PCT/US2021/041775, dated Oct. 8, 2021, 12 pages.
Restriction Requirement dated Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and

(56) References Cited

OTHER PUBLICATIONS

Self-Organizing Map Neural Network," International Solid-State Circuits Conference, Session 7, Image Sensors, Feb. 10, 2014, pp. 128-130, XP055826878.
Snoeij M.F., et al., "A low Power col. Parallel 12-bit ADC for CMOS Imagers," XP007908033, Jun. 1, 2005, pp. 169-172.
Office Action dated Sep. 26, 2022 for Korean Patent Application No. 10-2020-7002496, filed on Jun. 26, 2018, 17 pages.
Office Action dated Aug. 30, 2022 for Japanese Patent Application No. 2020505830, filed on Aug. 9, 2018, 5 pages.
Notice of Allowance dated Oct. 21, 2022 for U.S. Appl. No. 16/899,908, filed Jun. 12, 2020, 10 pages.
Office Action dated Sep. 29, 2022 for Taiwan Application No. 108122878, filed Jun. 28, 2019, 9 pages.
Corrected Notice of Allowance dated Mar. 29, 2022 for U.S. Appl. No. 17/150,925, filed Jan. 15, 2021, 2 Pages.
Non-Final Office Action dated Mar. 28, 2022 for U.S. Appl. No. 17/072,840, filed Oct. 16, 2020, 8 Pages.
Office Action dated Mar. 17, 2022 for Taiwan Application No. 20180124384, 26 pages.
Office Action dated Mar. 29, 2022 for Japanese Patent Application No. 2020520431, filed on Jun. 25, 2018, 10 pages.
Notice of Allowance dated Jul. 5, 2022 for U.S. Appl. No. 16/899,908, filed Jun. 12, 2020, 10 pages.
Notice of Allowance dated Apr. 19, 2022 for U.S. Appl. No. 16/899,908, filed Jun. 12, 2020, 10 pages.
Notice of Allowance dated Apr. 27, 2022 for U.S. Appl. No. 16/896,130, filed Jun. 8, 2020, 08 pages.
Notice of Allowance dated Apr. 28, 2022 for U.S. Appl. No. 16/435,451, filed Jun. 7, 2019, 09 pages.
Notice of Allowance dated Jun. 8, 2022 for U.S. Appl. No. 17/150,925, filed Jan. 15, 2021, 10 pages.
Office Action for European Application No. 18179851.3, dated May 19, 2022, 7 pages.
Office Action dated Jul. 5, 2022 for Korean Application No. 10-2020-7002533, filed Jun. 25, 2018, 13 pages.
Office Action dated May 18, 2022 for Taiwan Application No. 108122878, 24 pages.
Office Action dated Jul. 12, 2022 for Japanese Application No. 2019-571699, filed Jun. 25, 2018, 5 pages.
Office Action dated Jul. 19, 2022 for Japanese Application No. 2019571598, filed Jun. 26, 2018, 10 pages.
Corrected Notice of Allowability dated Jan. 9, 2023 for U.S. Appl. No. 17/150,925, filed Jan. 15, 2021, 8 pages.
Final Office Action dated Dec. 2, 2022 for U.S. Appl. No. 17/072,840, filed Oct. 16, 2020, 9 pages.
Notice of Allowance dated Dec. 6, 2022 for U.S. Appl. No. 16/896,130, filed Jun. 8, 2020, 8 pages.
Notice of Allowance dated Apr. 7, 2021 for U.S. Appl. No. 16/436,137, filed Jun. 10, 2019, 9 pages.
Notice of Allowance dated Dec. 9, 2022 for U.S. Appl. No. 16/435,451, filed Jun. 7, 2019, 8 pages.
Notice of Allowance dated Feb. 10, 2023 for U.S. Appl. No. 16/899,908, filed Jun. 12, 2020, 9 pages.
Notice of Allowance dated Nov. 21, 2022 for U.S. Appl. No. 17/242,152, filed Apr. 27, 2021, 10pages.
Notice of Allowance dated Dec. 22, 2022 for U.S. Appl. No. 17/496,712, filed Oct. 7, 2021, 13 pages.
Office Action dated Nov. 2, 2022 for Taiwan Application No. 107128759, filed Aug. 17, 2018, 16 pages.
Office Action dated Dec. 1, 2022 for Korean Application No. 10-2020-7002306, filed Jun. 25, 2018, 13 pages.
Office Action dated Nov. 1, 2022 for Japanese Patent Application No. 2020-520431, filed on Jun. 25, 2018, 11 pages.
Office Action dated Nov. 15, 2022 for Taiwan Application No. 108120143, filed Jun. 11, 2019, 8 pages.
Office Action dated Jan. 5, 2023 for Chinese Application No. 201980043907.7, filed Jun. 28, 2019, 14 pages.
Office Action dated Feb. 7, 2023 for Japanese Application No. 2019-571699, filed Jun. 25, 2018, 5 pages.
International Preliminary Report on Patentability for International Application No. PCT/US2021/054327, dated Apr. 20, 2023, 7 pages.
International Preliminary Report on Patentability for International Application No. PCT/US2021/057966, dated May 19, 2023, 12 pages.
Notice of Allowance dated Jun. 1, 2023 for U.S. Appl. No. 16/899,908, filed Jun. 12, 2020, 9 pages.
Notice of Allowance dated Mar. 1, 2023 for U.S. Appl. No. 17/242,152, filed Apr. 27, 2021, 9 pages.
Notice of Allowance dated Apr. 13, 2023 for U.S. Appl. No. 17/072,840, filed Oct. 16, 2020, 6 pages.
Notice of Allowance dated Jun. 16, 2023 for U.S. Appl. No. 17/242,152, filed Apr. 27, 2021, 9 pages.
Notice of Allowance dated Mar. 17, 2023 for U.S. Appl. No. 16/896,130, filed Jun. 8, 2020, 8 pages.
Notice of Allowance dated Apr. 24, 2023 for U.S. Appl. No. 17/496,712, filed Oct. 7, 2021, 12 pages.
Office Action dated Jun. 1, 2023 for Korean Application No. 10-2020-7002306, filed Jun. 25, 2018, 3 pages.
Office Action dated Mar. 10, 2023 for Chinese Application No. 201880053600.0, filed Jun. 25, 2018, 10 pages.
Office Action dated Feb. 15, 2023 for Chinese Application No. 201980049477.X, filed Jun. 11, 2019, 19 pages.
Office Action dated Mar. 16, 2023 for Korean Patent Application No. 10-2020-7002496, filed on Jun. 26, 2018, 3 pages.
Office Action dated May 9, 2023 for Japanese Patent Application No. 2020-520431, filed on Jun. 25, 2018, 6 pages.
Office Action dated May 9, 2023 for Japanese Patent Application No. 2020-563959, filed on Nov. 12, 2020, 5 pages.
Corrected Notice of Allowance dated Aug. 9, 2023 for U.S. Appl. No. 17/072,840, filed Oct. 16, 2020, 3 pages.
International Preliminary Report on Patentability for International Application No. PCT/US2021/065174 dated Jul. 13, 2023, 9 pages.
Notice of Allowance dated Oct. 2, 2023 for U.S. Appl. No. 16/435,451, filed Jun. 7, 2019, 10 pages.
Notice of Allowance dated Oct. 4, 2023 for U.S. Appl. No. 17/242,152, filed Apr. 27, 2021, 9 pages.
Notice of Allowance dated Jul. 7, 2023 for U.S. Appl. No. 16/896,130, filed Jun. 8, 2020, 8 pages.
Notice of Allowance dated Sep. 13, 2023 for U.S. Appl. No. 16/899,908, filed Jun. 12, 2020, 9 pages.
Notice of Allowance dated Aug. 18, 2023 for U.S. Appl. No. 17/496,712, filed Oct. 7, 2021, 12 pages.
Notice of Allowance dated Jun. 22, 2023 for U.S. Appl. No. 16/435,451, filed Jun. 7, 2019, 10 pages.
Notice of Allowance dated Jul. 31, 2023 for U.S. Appl. No. 17/072,840, filed Oct. 16, 2020, 6 pages.
Office Action dated Jul. 4, 2023 for Korean Application No. 10-2020-7002533, filed Jun. 25, 2018, 3 pages.
Office Action dated Jul. 4, 2023 for Japanese Application No. 2019571598, filed Jun. 26, 2018, 34 pages.

* cited by examiner

DETECTING HIGH INTENSITY LIGHT IN PHOTO SENSOR

CROSS REFERENCE TO RELATED APPLICATIONS

This application is a continuation of U.S. Non-Provisional application Ser. No. 15/983,379 filed May 18, 2018 which claims the benefit and priority of U.S. Provisional Application No. 62/546,993 filed Aug. 17, 2017, which are incorporated by reference in their entirety for all purposes.

BACKGROUND

The present disclosure relates generally to optical sensors, and more particularly, to backside illumination optical sensors in stacked assembly.

Optical sensors are electronic detectors that convert light into an electronic signal. In photography, a shutter is a device that allows light to pass for a determined period of time, exposing the optical sensors to the light in order to capture an image of a scene. Rolling shutter is a method of image capture in which a still picture or each frame of a video is captured by scanning across the scene rapidly in a horizontal or vertical direction. That is, every pixel is not captured at the same time; pixels from different rows are captured at different times. Rolling shutter is mostly used in cell phone sensors. Machine vision, in contrast, uses global shutter where every pixel is captured at the same time.

Most optical sensors use backside illumination. A back-illuminated sensor is a type of digital optical sensor that uses a particular arrangement of imaging elements to increase the amount of light captured, improving low-light performance. A traditional front-illuminated digital camera is constructed similar to the human eye, with a lens at the front and photodetectors at the back. This orientation of the sensor places the active matrix of the digital camera sensor, a matrix of individual picture elements, on its front surface and simplifies manufacturing. The matrix and its wiring, however, reflect some of the light, reducing the signal that is available to be captured. A back-illuminated sensor contains the same elements, but arranges the wiring behind the photocathode layer by flipping the silicon wafer during manufacturing and then thinning its reverse side so that light can hit the photocathode layer without passing through the wiring layer, thereby improving the chance of an input photon being captured.

However, conventional back-illuminated sensors tends to have higher leakage when exposed to light. Also, the photodiode fill factor, or the ratio of light-sensitive area of a pixel to total pixel area, is relatively low. A large fill factor is beneficial because more of the pixel area is used for photocollection, which simultaneously improves signal-to-noise ratio (SNR) and dynamic range. The dynamic range of an image sensor measures how wide of a range of lighting the sensor can accurately capture. The wider the dynamic range of the image sensor, the more details can be shown under low light conditions and thus the more versatile the imaging system becomes. The SNR of an image sensor measures the ratio between the signal and its associated noise. An image sensor with low SNR will have a high amount of noise appearing in the captured image. An image sensor with high SNR can be used in low light conditions.

SUMMARY

Embodiments relate to a pixel in a photo sensor including a photo diode, a floating diffusion point, and a transistor between the photo diode and the floating diffusion point. A gate of the transistor is applied with an intermediate voltage between a turn-off voltage of the transistor and a turn-on voltage of the transistor to transfer charge from the photo diode to the floating diffusion point responsive to an intensity of light incident on the photo diode during an exposure phase exceeding a threshold intensity. The gate of the transistor is applied with the turn-on voltage in a sensing phase subsequent to the exposure phase to transfer the charge from the photo diode to the floating diffusion point.

DETAILED DESCRIPTION OF THE PREFERRED EMBODIMENTS

Reference will now be made in detail to the preferred embodiment, an example of which is illustrated in the accompanying drawings. Whenever possible, the same reference numbers will be used throughout the drawings to refer to the same or like parts.

Embodiments relate to a stacked photo sensor assembly where two substrates are stacked vertically. The two substrates are connected via interconnects at a pixel level to provide a signal from a photodiode at a first substrate to circuitry on a second substrate. A voltage signal corresponding to the amount of charge in the first substrate is generated and processed in the second substrate. Two separate schemes are used for detecting light intensity in low light conditions and high light conditions. In high light conditions, two threshold voltages are set and the time between the crossing of a sensor voltage at the two threshold voltages is measured to determine the light intensity in the high light conditions. In low light conditions, a comparator is used to compare the voltage level of the sensor voltage relative to a reference voltage that increase over time. The time when the reference voltage reaches the sensor voltage level is detected to determine the light intensity in the low light conditions.

Example System Architecture

Figure 1:
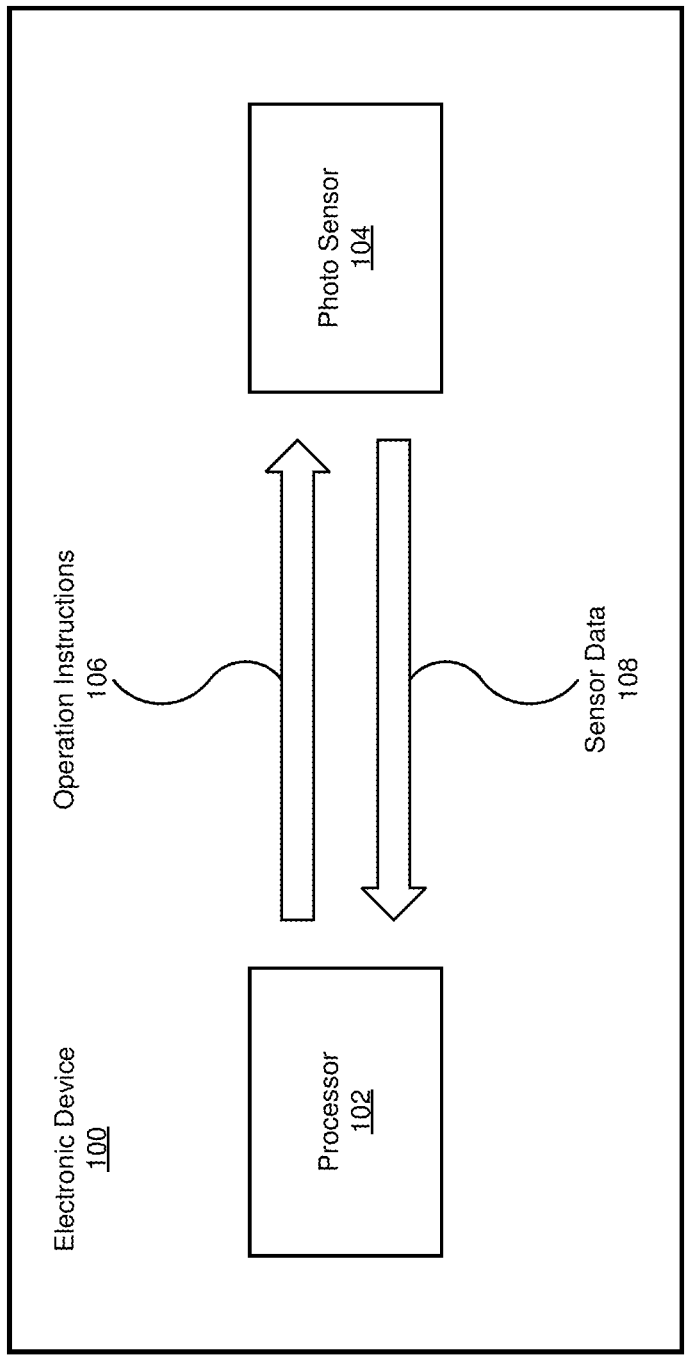
FIG. 1 is a high-level block diagram illustrating an electronic device including a photo sensor, according to one embodiment.

FIG. 1 is a high-level block diagram illustrating the electronic device 100, according to one embodiment. In one embodiment, the electronic device 100 includes, among other components, a processor 102 and a photo sensor 104 that are commutatively coupled. The electronic device 100 may include other components not illustrated in FIG. 1 such as memory and various other sensors.

The processor 102 is an electronic circuit that performs, among others, operations on a data source for providing images. The data source may include the photo sensor 104 that provides sensor data 108. The processor 102 also generates operation instructions 106 that are sent to the photo sensor 104 to cause the photo sensor 104 to perform certain operations. The processing performed by the processor 102 may include various digital signal processing to improve the quality of images or edit the images.

The photo sensor 104 is a circuit that measures intensity of light impinging on the photo sensor 104 on a pixel-by-pixel basis using photoconversion. Measuring light intensity may involve detecting light by a photodiode in a pixel. In response, the pixel performs photoconversion on the detected light into a voltage or current signal. The voltage or current signal representing the intensity of light detected at each pixel may be digitized into sensor data 108, and sent over to the processor 102.

Although not illustrated in FIG. 1, the electronic device 100 may include memory where the sensor data 108 is stored. The electronic device 100 may also include a display interface for sending the sensor data 108 for display on a display device (e.g., liquid crystal display (LCD) or organic light emitting diode (OLED) display).

Figure 2:
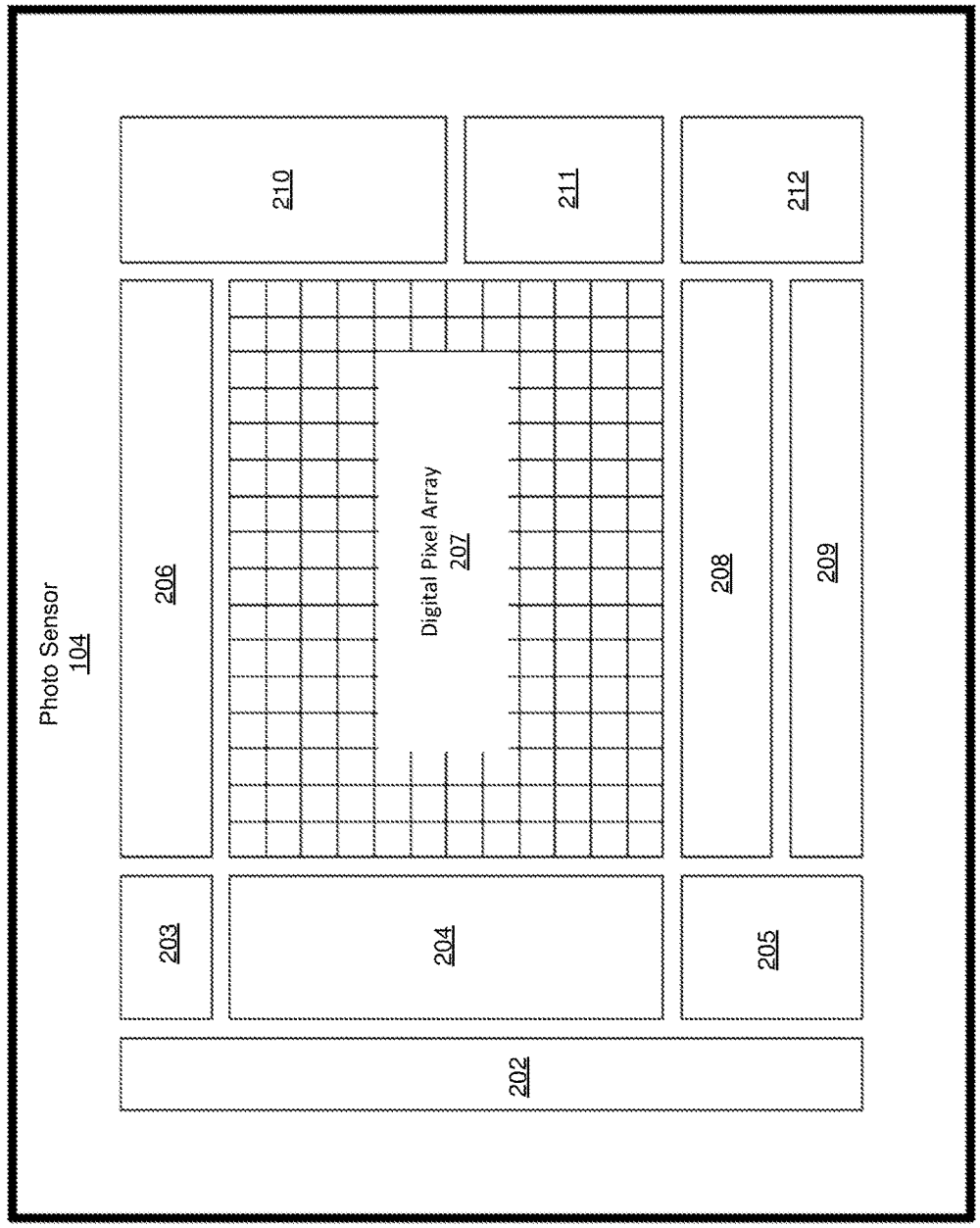
FIG. 2 is a schematic view illustrating the photo sensor of FIG. 1, according to one embodiment.

FIG. 2 is a schematic view illustrating the photo sensor 104, according to one embodiment. The photo sensor 104 includes, among other components, a digital block 202, a global counter 203, a row drivers and global signal drivers module 204, Mobile Industry Processor Interface (MIPI) 205, counter buffers 206, a digital pixel array 207, sense amplifiers 208, a line memory 209, a power conditioner 210, a ramp generation and buffers module 211, and a sense amplification biasing module 212.

The digital block 202 is a circuit that processes digital signals associated with the operation of the photo sensor 104. In one or more embodiments, at least part of the digital block 202 may be provided as part of the digital pixel array 207 instead of being a circuit separate from the digital pixel array 207.

The global counter 203 is a digital sequential logic circuit constructed of cascading flip-flops, and provides counter signals to various components of the photo sensor 104.

The row drivers and global signal drivers module 204 is a circuit that provides signals to rows of pixels via scan lines (not shown). The signal provided to each row of pixels indicates sensing of image signal and/or resetting operations at each row of pixels.

MIPI 205 is a serial interface for transmitting the sensor data 108 from the photo sensor 104 to the processor 102. An MIPI interface typically has a single clock lane and two data lanes (not shown) that carry serial data. These three lanes carry signals on pairs of wires where the signals are often differential.

The counter buffers 206 is a circuit that receives counter signals from the global counter 203, and sends signals to columns of pixels in the digital pixel array 207 to coordinate sensing and resetting operations.

The digital pixel array 207 includes a plurality of pixels. In one embodiment, the digital pixel array is arranged in two dimensions, addressable by row and column. Each pixel is configured to sense light and output a signal corresponding to the intensity of the input light. Each pixel may include components as described below with reference to FIG. 3.

The sense amplifiers 208 are elements in the read circuitry that are used to the read out of the digital signals from the digital pixel array 207. The sense amplifiers 208 sense low power signals from a bitline that represents the intensity of light captured by the pixels in the digital pixel array 207. The sense amplifiers 208 may generate a digital output signal by utilizing an analog-to-digital converter (ADC). In one or more embodiments, at least part of the sense amplifiers 208 may be included in the digital pixel array 207.

The line memory 209 temporarily stores the sensed digital values of the light intensity detected at the digital pixel array 207, as sensed by the sense amplifiers 208 and processed by digital block 202 before sending the digital values to the processor 102 via MIPI 205 as the sensor data 108.

The power conditioner 210 is a circuit that improves the quality of the power that is delivered to components of the photo sensor 104. The power conditioner 210 may maintain and deliver a constant voltage that allows the components of the photo sensor 104 to function properly. In one embodiment, the power conditioner 210 is an AC power conditioner which smooths the sinusoidal AC waveform. In alternate embodiments, the power conditioner 210 is a power line conditioner which takes in power and modifies it based on the requirements of the components connected to the power line conditioner.

The ramp generator and buffers module 211 comprises a ramp generator and buffers. The ramp generator is a function generator that increases its voltage to a particular value. The ramp generator may be used to avoid jolts when changing a load. The buffers provide electrical impedance transformation from one circuit to another to prevent the ramp generator from being affected by the load.

The sense amplification biasing module 212 provides biasing voltage signal to the sense amplifiers 208. The biasing voltage signal is a predetermined voltage for the purpose of establishing proper operating conditions of the sense amplifiers 208 such as a steady DC voltage.

Example Stacked Photo Sensor Assembly

Figure 3:
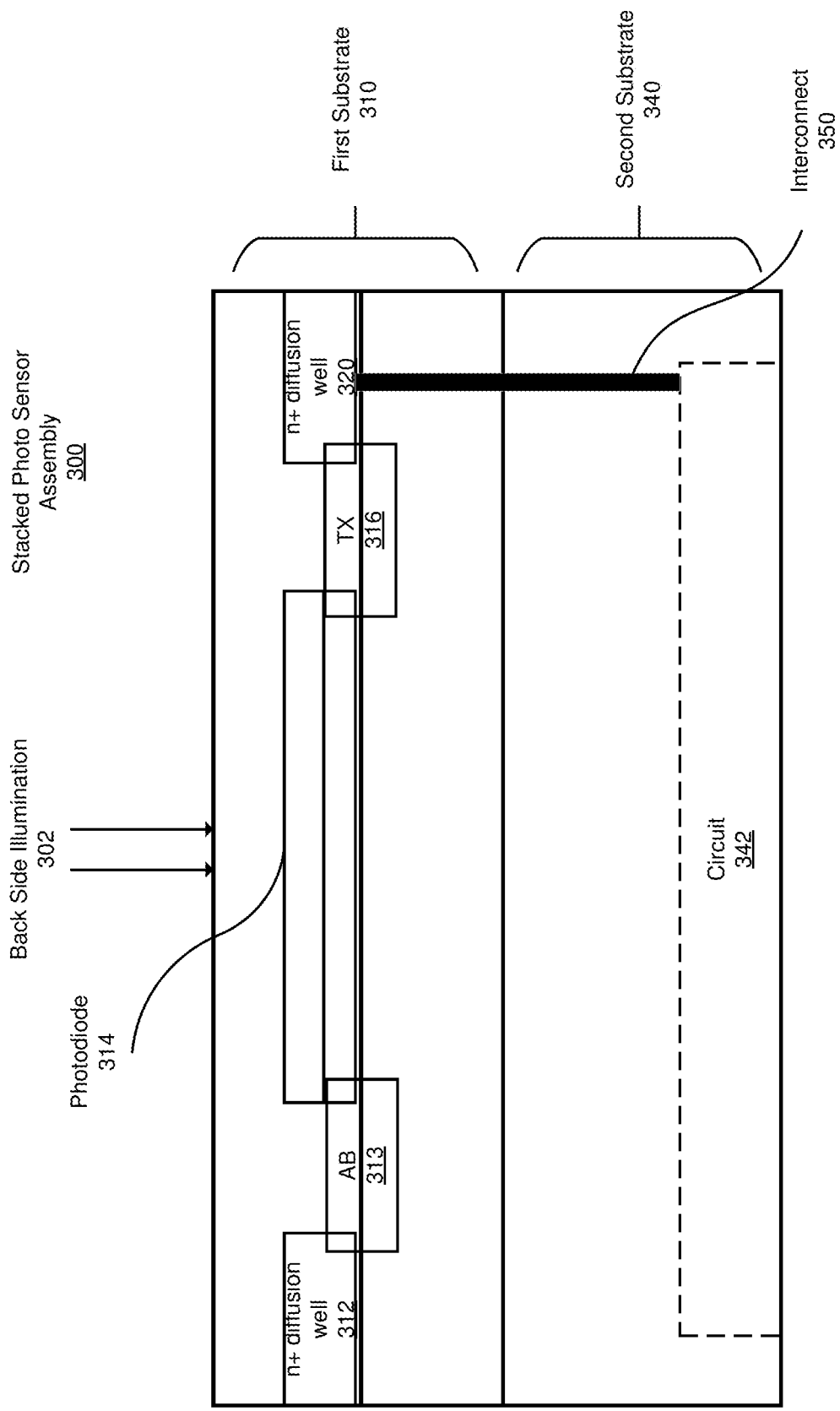
FIG. 3 is a cross-sectional view the photo sensor in a stacked structure, according to one embodiment.

FIG. 3 is a cross-sectional view illustrating the stacked photo sensor assembly 300, according to one embodiment. In one embodiment, the stacked photo assembly includes a first substrate 310 coupled to a second substrate 340. The first substrate 310 may be a back-side illumination 302 sensor that is flipped over and includes, among other components, a first n+ diffusion well 312, a photodiode 314, a transistor AB 313, a transistor TX 316, and a second n+ diffusion well 320.

Each of transistor AB 313 and transistor TX 316 includes an active layer, a drain electrode coupled to the active layer, a photodiode 314 that serves as a source of both transistor AB and transistor TX, an insulation layer over the active layer, and a gate electrode (not shown). By controlling a voltage level at the gates of the transistors AB 313 and the transistor TX 316, the transistors AB 313 and the transistor TX 316 can be turned on or off. The gates of these transistors receive signals from circuits external to the digital pixel array 207.

The first n+ diffusion well 312 is an N doped implant region formed in the first substrate 310. The first n+ diffusion well 312 receives photoelectrons that are transferred from the photodiode 314 when transistor AB 313 is turned on during non-exposure times. This is equivalent to a closed shutter mode in a traditional film camera. The transfer of photoelectrons from the photodiode 314 to the first n+ diffusion well 312 ensures that no photoelectrons are accumulated on the photodiode 314, as the non-exposure times are periods when no signal is generated. The first n+ diffusion well 312 is typically connected to a positive voltage source, for example VDD, so the photoelectrons are drained away. During an exposure time, which is equivalent to the shutter open mode in a film camera, both transistor AB 313 and transistor TX 316 are turned off and the photoelectrons are initially stored inside the photodiode 314. At the end of exposure, transistor TX 316 is turned on. As a result, the charge stored in the photodiode 314 is transferred to the second n+ diffusion well 320.

The photodiode 314 is a semiconductor device that converts light into an electric current. Current is generated when photons are absorbed in the photodiode 314. The photodiode 314 may be a p-n junction or PIN structure. When the intensity of light through back-side illumination 302 is higher, the amount of charge accumulated on the photodiode 314 is high. Similarly, when the intensity of light through back-side illumination 302 is lower, the amount of charge accumulated on the photodiode 314 is low.

The interconnect 350 may be a pixel level direct interconnect from the second n+ diffusion well 320 to a circuit 342 in the second substrate 340. In some embodiments, the interconnect 350 may be a pixel level direct interconnect from the output of an amplifier (not shown in FIG. 3) in the first substrate 310 to the circuit 342 in the second substrate 340. The amplifier acts as a buffer and isolates a floating diffusion point from the interconnect 350, as there is high leakage current and parasitic capacitance associated with the interconnect 350. The amplifier and floating diffusion point are described below with reference to FIG. 4 in detail. In one embodiment, the interconnect 350 transmits a voltage signal that reflects the amount of charge transferred from the photodiode 314 to the second n+ diffusion well 320. In alternative embodiments, the interconnect 350 transmits a current signal that reflects the amount of charge transferred from the photodiode 314 to the second n+ diffusion well 320. The interconnect 350 carries the voltage signal to the circuit 342 for further processing such as sampling and analog-to-digital conversion. In still other embodiments, the stacked photo sensor assembly 300 may include additional interconnects that also transmit signals from the circuit 342 of the second substrate 340 to the first substrate 310. For example, signals for controlling transistor AB 313 and transistor TX 316 may be transmitted from the circuit 342 via these additional interconnects.

Embodiments move various circuit components provided on the first substrate 310 in conventional photo sensors to the second substrate 340, and connect the circuits of the second substrate 340 to the components in the first substrate 310 via the pixel level interconnect 350. The various circuit components moved to the second substrate 340 may include, among others, switches, amplifiers and current source. In this way, the area occupied by components in the first substrate 310 can be beneficially reduced and the fill factor can be increased.

Example Circuitry of a Pixel of the Photo Sensor

Figure 4:
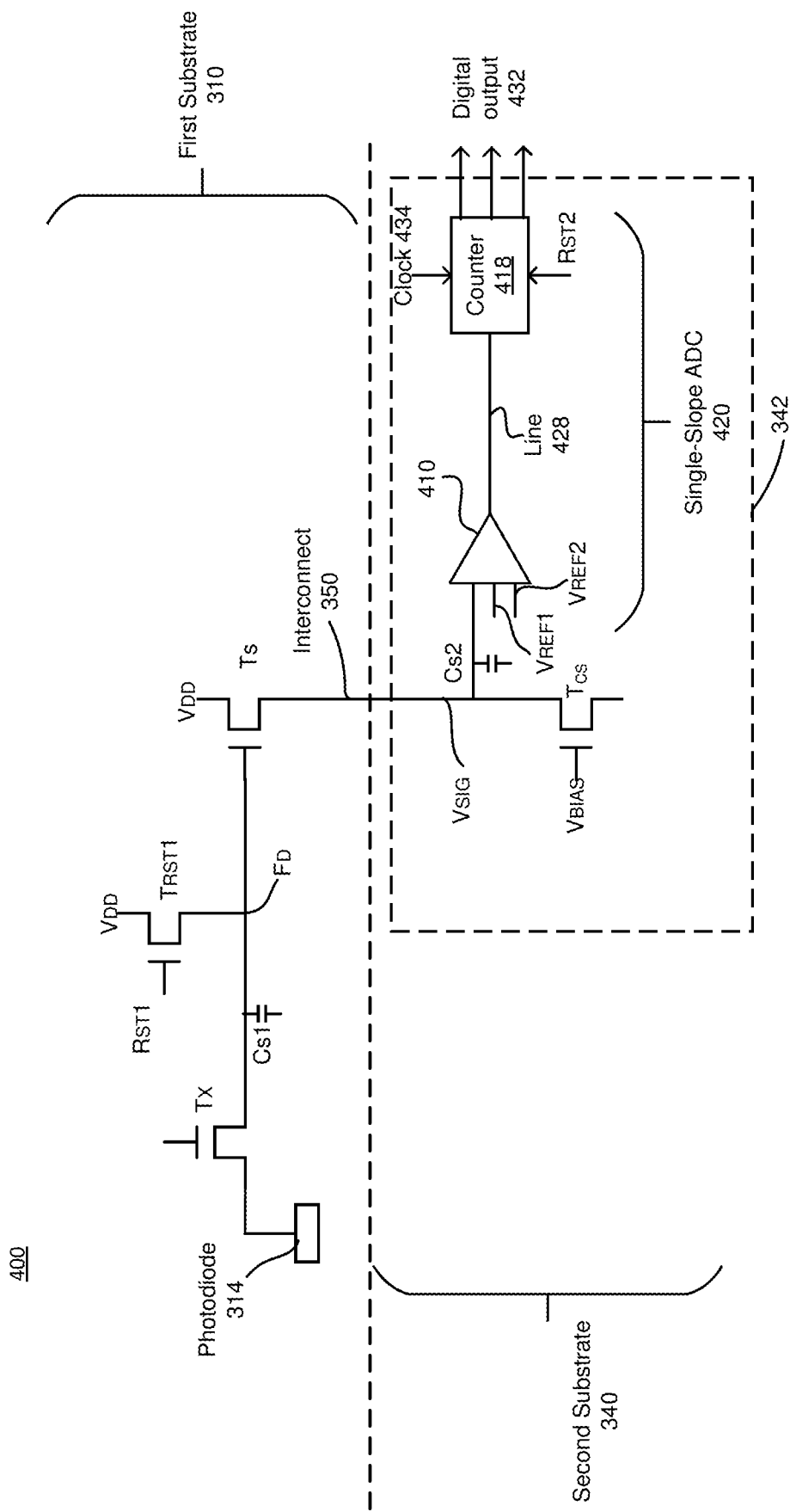
FIG. 4 is a circuit diagram illustrating a pixel of the photo sensor, according to one embodiment.

FIG. 4 is a circuit diagram illustrating a pixel 400 of the photo sensor 104, according to one embodiment. In the embodiment of FIG. 4, the first substrate 310 includes, among other components, the photodiode 314, a transistor TX, a first reset transistor $T_{RST10}$, and an amplifier $T_S$. Parasitic capacitance is present in a first capacitor Cs1 in the first substrate 310 between the transistor TX and the first reset transistor $T_{RST1}$. The operation of photodiode 314 and transistor TX is described above with reference to FIG. 3.

During the exposure phase of the operation, the gate voltage of the transistor TX is maintained at an intermediate voltage that neither turns on nor turns off the transistor TX. Specifically, the intermediate voltage herein refers to 0.3V to 0.7V. In this range, the charge accumulated in the photodiode 314 may move to the floating diffusion point $F_D$. The intermediate voltage refers to a voltage that is between an active voltage and inactive voltage of the transistor TX. The potential underneath the transistor TX gate serves as a barrier between the photodiode 314 and the floating diffusion point $F_D$. If the transistor TX gate is connected to zero or negative voltage, the barrier is high, and more charge is accumulated inside the photodiode 314. If the transistor TX gate is connected to a very positive voltage (e.g., 2.5V to 3.3V), the transistor TX gate is fully turned on, and there is no barrier. The intermediate voltage results in a medium barrier where all charge generated by a low level light is accumulated inside the photodiode 314 while for bright light, charge flows over the barrier to accumulate on the floating diffusion point $F_D$ once the photodiode 314 is filled up.

By placing the gate voltage at the intermediate voltage, the charge moves from the photodiode 314 to the second n+ diffusion well 320 when the light intensity of the back side illumination 302 exceeds a certain threshold. If the light intensity of the back side illumination 302 does not exceed a threshold, the charge accumulates within the photodiode 314 without transferring over to the second n+ diffusion well 320. Conversely, in a sensing phase after the exposure phase, the transistor TX is fully turned on to transfer the charge accumulated in the photodiode 314 to the second n+ diffusion well 320.

The voltage level at the floating diffusion point $F_D$ serves as a proxy that indicates the duration and/or intensity of light exposure of the photodiode 314 during an exposure phase. The floating diffusion point $F_D$ is connected to the second n+ diffusion well 320. As the charge is transferred from the photodiode 314 to the floating diffusion point $F_D$ via the transistor TX, the voltage level at the floating diffusion point $F_D$ is decreased. When the duration and/or intensity of light exposure of the photodiode 314 during the exposure phase is increased, the voltage level at the floating diffusion point $F_D$ is also decreased. If the duration and/or intensity of light exposure of the photodiode 314 is below a certain level that is set by the transistor TX gate intermediate voltage, the voltage level at the floating diffusion point $F_D$ will not change as there is no charge transferred from photodiode 314 to the floating diffusion point $F_D$.

The first reset transistor $T_{RST1}$ functions to reset the voltage at floating diffusion point $F_D$ when the first reset transistor $T_{RST1}$ is turned on. The first reset transistor $T_{RST1}$ is turned on when a reset signal RST1 is received at the gate of the first reset transistor $T_{RST1}$ after each cycle of exposure and sensing. The drain of the first reset transistor $T_{RST1}$ is connected to a voltage source VDD. The source of the first reset transistor $T_{RST1}$ is connected to the floating diffusion point $F_D$.

The amplifier $T_S$ is a source follower amplifier that amplifies its gate signal to generate a voltage signal $V_{SIG}$ that is transmitted to the circuit 342. The gate of the amplifier $T_S$ is connected to the floating diffusion point $F_D$. The drain of the amplifier $T_S$ is connected to a voltage source VDD. The source of the amplifier $T_S$ is connected to the interconnect 350. The voltage signal $V_{SIG}$ corresponds to a voltage level at the source terminal of the amplifier $T_S$ as defined by the voltage level at the floating diffusion point $F_D$.

The circuit 342 is provided in the second substrate 340. The circuit receives the voltage signal $V_{SIG}$ via the interconnect 350, processes the voltage signal $V_{SIG}$, and generates a digital output 432 indicating the intensity and/or duration of the light to which the photodiode 314 was exposed.

The circuit 342 may include, among other components, transistor $T_{CS}$, a comparator 410, and a counter 418. The transistor $T_{CS}$ operates as a current source when turned on. In one embodiment, the gate of the current source $T_{CS}$ is applied with a pulse of bias voltage $V_{BIAS}$ throughout exposure phases and sensing phases of the pixel operation. The drain of the current source $T_{CS}$ is connected to the interconnect 305 and the source of the current source $T_{CS}$ is grounded. Parasitic capacitance is present in a second capacitor Cs2 in the second substrate 340 between the current source $T_{CS}$ and the comparator 410.

When the light intensity received at the photodiode 314 is above the threshold, the charge transfers over to the floating diffusion point $F_D$ during the exposure phase because the transistor Tx is placed at the intermediate voltage. As a result, the gate voltage at the amplifier $T_S$ gradually drops, causing the voltage signal $V_{SIG}$ at the interconnect 305 to gradually drop.

The comparator 410 and the counter 418 in combination function as a single-slope analog-to-digital converter (ADC) that produces the digital output 432 that represents the rate of decline in the voltage signal $V_{SIG}$, which in turn, indicates the intensity and/or duration of light incident on the photodiode 314, as described below in detail with reference to FIGS. 5 and 6. After its operation, the comparator 410 may be reset by providing reset signal RST2 to the counter 418. Providing the reset signal RST2 to the counter 418 resets the counted value at the counter 418 back to zero.

The comparator 410 detects times at which the voltage signal $V_{SIG}$ reaches two reference voltages. For this purpose, the comparator 410 receives the voltage signal $V_{SIG}$ at a first terminal via the interconnect 350, first reference voltage $V_{REF1}$ at a second terminal and a second reference voltage $V_{REF2}$ at a third terminal. After the comparator 410 detects that the voltage signal $V_{SIG}$ reached $V_{REF1}$ or $V_{REF2}$, the comparator 410 sends a triggering signal over line 428 to the counter 418.

The counter 418 counts the number of clock cycles for the voltage signal $V_{SIG}$ to reach the second reference voltage $V_{REF2}$ starting from the first reference voltage $V_{REF1}$. The counter 418 is commutatively coupled to the comparator 410 by line 428, receives a clock signal 434 and a reset signal RST2, and outputs a digital output 432. In one embodiment, the counter 418 starts counting responsive to receiving a first triggering signal and stops counting responsive to receiving a second triggering signal. The digital output provided by the counter 418 may be a binary value. The digital output may be used to compute the slope of $V_{SIG}$, which directly corresponds to the intensity of light incident on the photodiode.

Example Pixel Operation

The pixel structure of the present disclosure is configured to measure high intensity light and low intensity light using different mechanisms during different phases (i.e. exposure phase and sensing phase). During the exposure phase, the pixel structure measures high intensity light while the same pixel structure measure lower intensity light.

Figure 5:
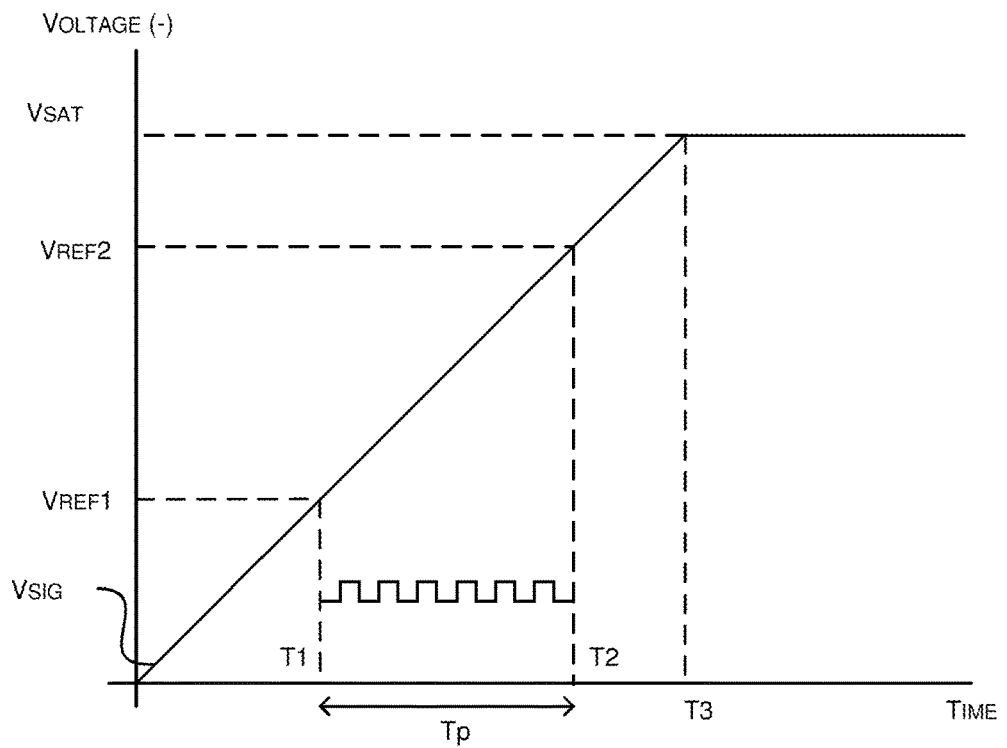
FIGS. 5 and 6 are graphs illustrating change in a voltage signal during an exposure phase when the pixel is exposed to high intensity light, according to one embodiment.
Figure 6:
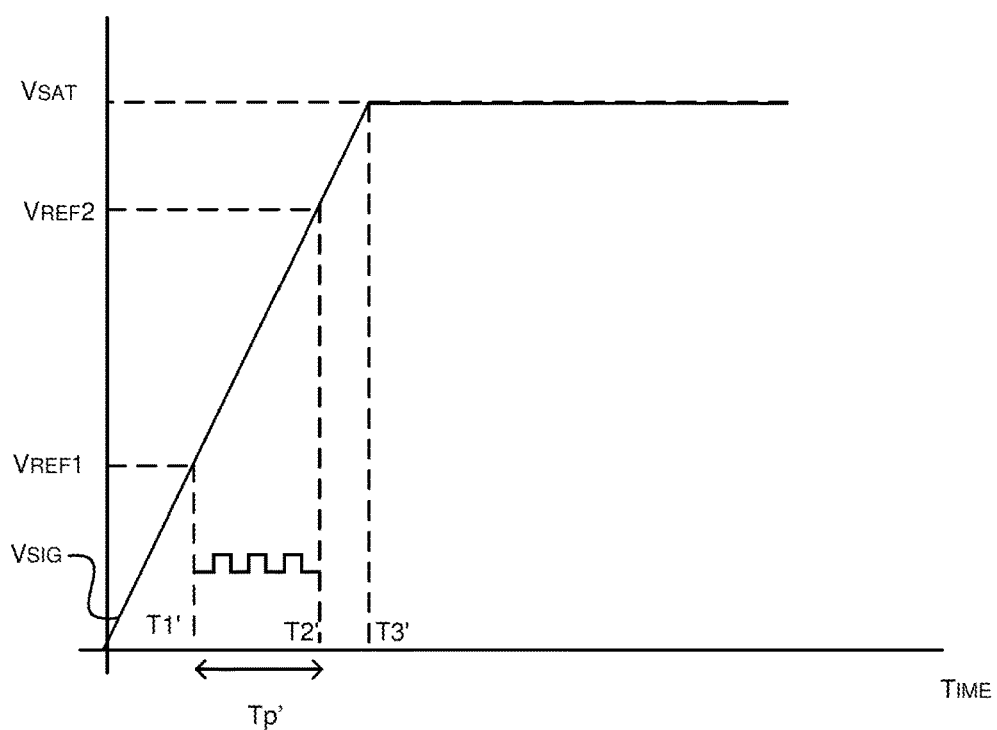

FIGS. 5 and 6 are graphs illustrating measuring of the high light intensity when during the exposure phase, according to one embodiment. In the exposure phase, as the voltage signal $V_{SIG}$ drops, the comparator 410 compares the voltage signal $V_{SIG}$ relative to two reference voltages, first reference voltage $V_{REF1}$ and second reference voltage $V_{REF2}$. When the voltage $V_{SIG}$ reaches the first reference voltage $V_{REF1}$, the comparator 410 sends a starting trigger signal to counter 418 over line 428 so that the counter 418 can start counting based on clock signal 434 received at the counter 418. Conversely, when the voltage signal $V_{SIG}$ reaches the second reference voltage $V_{REF2}$, the comparator 410 sends a stop signal to the counter 418 over line 428 to stop the counting. Based on the number of clock cycles between the two signals sent by the comparator 410 (as indicated by a counted value at the counter 418), the slope of the voltage signal $V_{SIG}$ line can be determined.

Taking the example of FIG. 5, the voltage signal $V_{SIG}$ gradually drops and reaches the first reference voltage $V_{REF1}$ at time T1 and then reaches the second reference voltage $V_{REF2}$ at time T2. Subsequently, the voltage signal $V_{SIG}$ further drops at time T3 to saturation voltage $V_{SAT}$ indicating that the first capacitor Cs1 at the floating diffusion point $F_D$ is fully saturated and the voltage signal $V_{SIG}$ is too low to be read out by the amplifier $T_S$). The period Tp indicates the time difference between T1 and T2.

If the slope of the voltage signal $V_{SIG}$ line is steeper as shown in FIG. 6 (i.e., the intensity of light incident on the photo diode is greater), the voltage signal $V_{SIG}$ reaches the first reference voltage $V_{REF1}$ and the second reference voltage $V_{REF2}$ at times T1' and T2', respectively. T1' and T2' are faster than T1 and T2 of FIG. 5. Further, the time period Tp' between T1' and T2' is shorter than the time period Tp between T1 and T2 of FIG. 5.

Therefore, by measuring the time difference between the time at which the voltage signal $V_{SIG}$ drops to the first reference voltage $V_{REF1}$ and the time at which the voltage signal $V_{SIG}$ drops to the second reference voltage $V_{REF2}$, the intensity of light incident on the photodiode 314 can be determined even if the photodiode 314 is saturated before the end of the exposure phase.

Although embodiments are primarily described above with reference to using a comparator 410 and a counter 418, various other types of circuits may be used to measure the slope of voltage signal $V_{SIG}$.

When the intensity of light incident on the photodiode 314 does not exceed the threshold, the charge accumulated remains in the photodiode 314 and is not transferred to the second n+ diffusion well 320 during the exposure phase. Therefore, there is no change left in the voltage at the floating diffusion point $F_D$ and no decrease in the voltage signal $V_{SIG}$ is detected during the exposure phase. In this case, the voltage signal $V_{SIG}$ changes only after the transistor TX is fully turned on at a sensing phase subsequent to the exposure phase. When the transistor TX is turned on, the voltage at the floating diffusion point $F_D$ decreases to a certain level from its initial reset voltage level and sets the gate voltage of the amplifier $T_S$ to a certain voltage. In response, the source terminal of the amplifier $T_S$ also reaches a certain voltage level.

Figure 7:
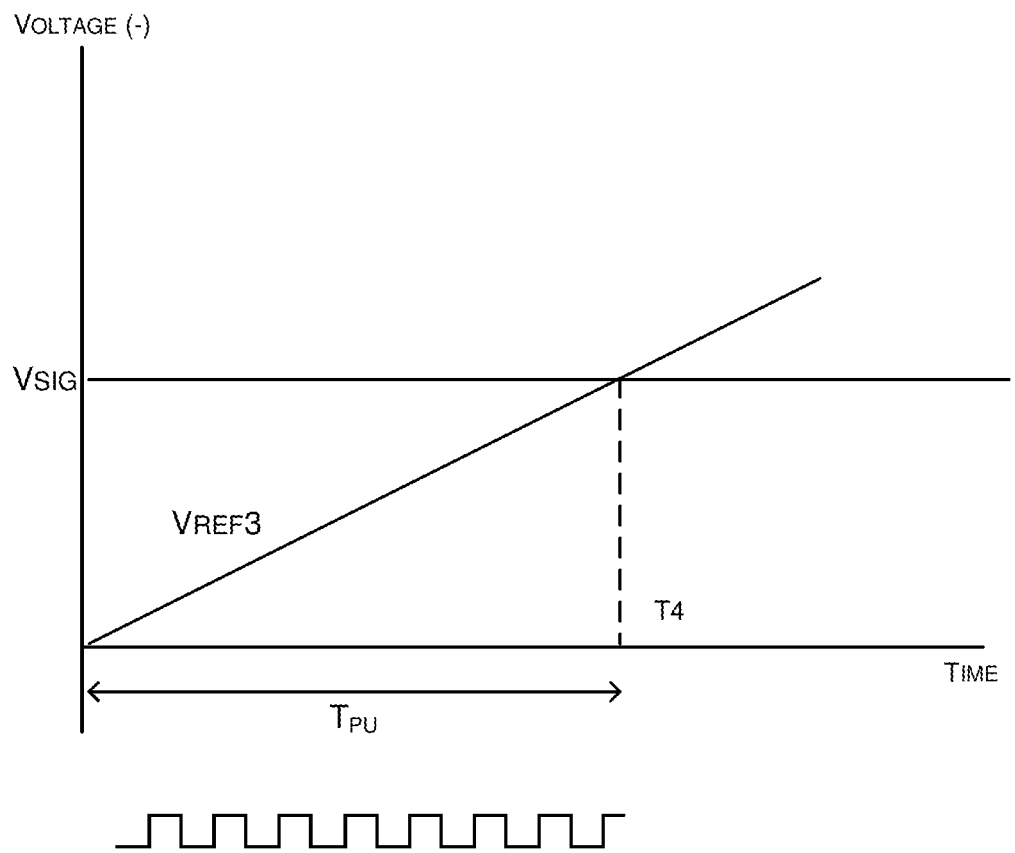
FIG. 7 is a graph illustrating change in the voltage signal in a sensing phase, according to one embodiment.

FIG. 7 is a graph illustrating measuring of the voltage signal $V_{SIG}$ level after the amplifier $T_S$ is turned on in the sensing phase, according to one embodiment. Contrary to FIGS. 5 and 6, the voltage signal $V_{SIG}$ at interconnect 350 remains relatively stable throughout the sensing phase subsequent to the exposure phase.

In the sensing phase, the comparator 410 is provided with the signal voltage $V_{SIG}$ at the first terminal and third reference voltage $V_{REF3}$ signal at a second terminal. In the embodiment of FIG. 7, $V_{REF3}$ is a ramp signal that sweeps from the minimum expected $V_{SIG}$ value to the maximum $V_{SIG}$ value. The third terminal of the comparator 410 is not used and placed in a high impedance state. At the start of the sensing phase, the counter 418 is turned on. While the counter 418 is running based on the clock signal 434, the third reference voltage $V_{REF3}$ signal is gradually increased. When the third reference voltage $V_{REF3}$ signal reaches the voltage signal $V_{SIG}$ at time T4, the counter 418 produces a stop signal over line 428 that stops the counter 418. The counter value of the counter 418 represents time period $T_{PU}$ between the starting time of the sensing phase and a time at which the third reference voltage $V_{REF3}$ signal to reach the voltage signal $V_{SIG}$ voltage level. If the voltage signal $V_{SIG}$ is higher, the higher the counter value would be. Hence, by detecting the counter value in the sensing phase, the voltage level of the voltage signal $V_{SIG}$ can be determined, which in turn enables the measuring of the light intensity below the threshold level.

The reference voltage $V_{REF3}$ may be provide by a signal generator (not shown). Although the embodiment of FIG. 7 uses the reference voltage $V_{REF3}$ that increase linearly, the reference voltage $V_{REF3}$ may increase in a non-linear manner in other embodiments.

Figure 8:
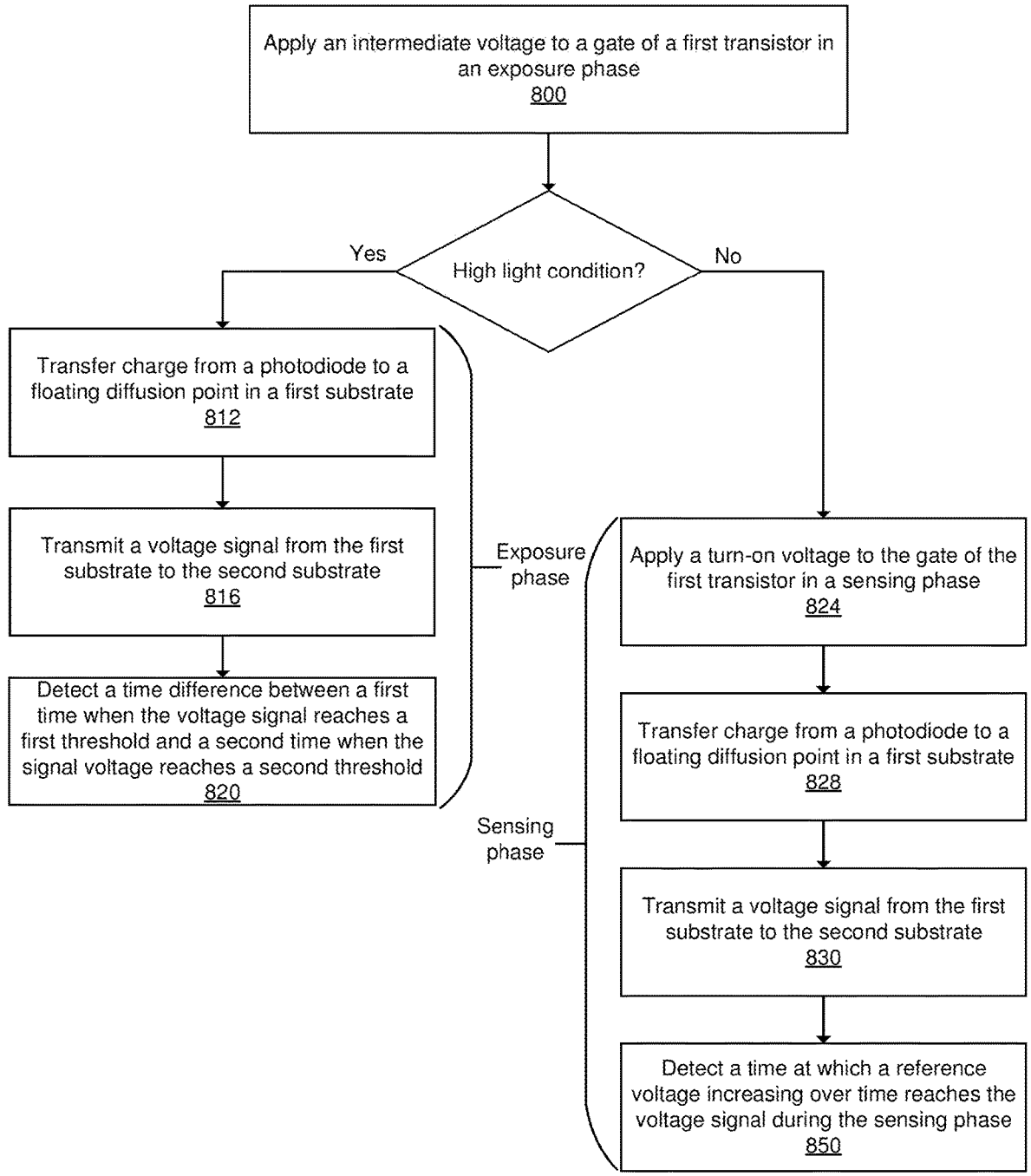
FIG. 8 is a flowchart illustrating a method of detecting light intensity in low light conditions and high light conditions, according to one embodiment.

FIG. 8 is a diagram illustrating a method of detecting light intensity in low light conditions and high light conditions, according to one embodiment. An intermediate voltage is applied 800 to the gate of a transistor TX in an exposure phase that neither turns on nor turns off the transistor TX.

By placing the gate voltage at the intermediate voltage, charge moves from the photodiode to the second n+ diffusion well when the light intensity of the back side illumination exceeds a certain threshold. In high light conditions, the light intensity received at the photodiode is above the threshold. As a result, charge from the photodiode is transferred 812 to a floating diffusion point $F_D$ in a first substrate.

A pixel level interconnect transmits 816 a voltage signal $V_{SIG}$ from the first substrate to the second substrate. The voltage signal $V_{SIG}$ represents an amplified version of a voltage at the floating diffusion point $F_D$. The circuit receives the voltage signal $V_{SIG}$ via the pixel level interconnect, processes the voltage signal $V_{SIG}$, and generates a digital output indicating the intensity and/or duration of the light to which the photodiode was exposed, as described in detail below.

The circuit in the second substrate detects 820 a time difference Tp between a first time T1 when the voltage signal $V_{SIG}$ reaches a first threshold and a second time T2 when the voltage signal $V_{SIG}$ reaches a second threshold different from the first threshold. The comparator in the second substrate generates a first output at the first time T1 at which the voltage signal $V_{SIG}$ corresponds to a first reference voltage $V_{REF1}$ and transmits the first output to the counter at the first time T1. The comparator also generates a second output at the second time T2 at which the voltage signal $V_{SIG}$ corresponds to the second reference voltage $V_{REF2}$ which is higher than the first reference voltage $V_{REF1}$ and transmits the second output to the counter at the second time T2. The counter counts a number of clock pulses between the first time T1 and the second time T2.

In a sensing phase subsequent to the exposure phase, a turn-on voltage is applied 824 to the gate of the transistor TX to place the transistor TX in a saturation state.

Charge from the photodiode is transferred 828 to the floating diffusion point $F_D$ in the first substrate when the intensity of light incident on the photodiode during the exposure phase exceeds a threshold intensity. If the light intensity does not exceed the threshold intensity, the charge accumulates within the photodiode without transferring over to the floating diffusion point $F_D$.

The pixel level interconnect transmits 830 the voltage signal $V_{SIG}$ from the first substrate to the second substrate. The circuit detects 850 a time at which a reference voltage $V_{REF1}$ increasing over time reaches the voltage signal $V_{SIG}$ during the sensing phase. The voltage signal $V_{SIG}$ remains relatively stable in the sensing phase subsequent to the exposure phase. The comparator is provided with the voltage signal $V_{SIG}$ and the first reference voltage $V_{REF1}$. At the start of the sensing phase, the counter is turned on. While the counter is running based on the clock signal, the first reference voltage $V_{REF1}$ is gradually increased. When the first reference voltage $V_{REF1}$ reaches the voltage signal $V_{SIG}$ at time T4, the counter produces a latch signal over line that stops the counter.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. An apparatus, comprising:
   a photodiode configured to generate charge in response to incident light within an exposure period; and
   a quantizer comprising a comparator and a memory configured to:
      perform at least one of a first quantization operation to generate a first digital output or a second quantization operation to generate a second digital output; and
      output, based on a range of an intensity of the incident light, one of the first digital output or the second digital output to represent the intensity of the incident light,
   wherein the first quantization operation comprises comparing, using the comparator, a first voltage representing at least a first part of the charge during the exposure period against one or more threshold voltages to generate one or more first comparison results, and storing the first digital output in the memory based on the one or more first comparison results; and
   wherein the second quantization operation comprises comparing, using the comparator, a second voltage representing at least a second part of the charge after the exposure period against a ramping threshold voltage to generate a second comparison result, and storing the second digital output in the memory based on the second comparison result.

2. The apparatus of claim 1, wherein the photodiode is configured to:
   store the second part of the charge until the photodiode saturates; and
   output the first part of the charge after the photodiode saturates.

3. The apparatus of claim 2, further comprising a capacitor;
   wherein the capacitor is configured to store the first part of the charge during the exposure period; and
   wherein the quantizer is configured to perform the first quantization operation on the first part of the charge stored in the capacitor during the exposure period.

4. The apparatus of claim 3, wherein the capacitor is configured to store the second part of the charge after the exposure period; and
wherein the quantizer is configured to perform the second quantization operation on the second part of the charge stored in the capacitor after the exposure period.

5. The apparatus of claim 4, further comprising a first transistor coupled between the photodiode and the capacitor;
wherein during the exposure period, a gate of the first transistor is configured to receive a first voltage to enable the photodiode to store the second part of the charge; and
wherein after the exposure period, the gate of the first transistor is configured to receive a second voltage to enable the photodiode to output the second part of the charge to the capacitor.

6. The apparatus of claim 5, wherein the first voltage sets a capacity of the photodiode for storing the second part of the charge.

7. The apparatus of claim 5, wherein the first voltage corresponds to an upper limit of the intensity of the incident light to be measured by the second quantization operation.

8. The apparatus of claim 5, wherein the first voltage is set based on a duration of the exposure period.

9. The apparatus of claim 5, wherein the first voltage is between an active voltage and inactive voltage of the first transistor.

10. The apparatus of claim 5, wherein the capacitor is implemented as a first diffusion region of the first transistor.

11. The apparatus of claim 4, further comprising a second transistor coupled between the photodiode and a charge sink, the charge sink being coupled with a second drain region of the second transistor;
wherein a duration of the exposure period is set based on enabling and disabling of the second transistor.

12. The apparatus of claim 1, wherein the first quantization operation comprises determining a time when the first voltage intersects with a threshold voltage of the one or more threshold voltages, and generating the first digital output based on the time.

13. The apparatus of claim 1, wherein the first quantization operation comprises determining a time elapsed between when the first voltage intersects with a first threshold voltage of the one or more threshold voltages and when the first voltage intersects with a second threshold voltage of the one or more threshold voltages, and generating the first digital output based on the time.

14. The apparatus of claim 1, wherein the first quantization operation comprises measuring a physical quantity indicative of a rate of change of a quantity of the first part of the charge within the exposure period, and generating the first digital output based on the measured physical quantity.

15. The apparatus of claim 1, wherein the second quantization operation comprises measuring a quantity of the second part of the charge.

16. The apparatus of claim 1, wherein the first digital output is provided to represent the intensity of the incident light based on a light condition of an environment the apparatus operates in, the light condition being indicative of the range of the intensity of the incident light received by the photodiode.

17. The apparatus of claim 1, wherein the photodiode is formed in a first semiconductor substrate;
wherein the quantizer is formed in a second semiconductor substrate; and
wherein the first semiconductor substrate and the second semiconductor substrate forms a stack.

18. A method comprising:
generating, a photodiode, charge in response to incident light within an exposure period;
performing, by a quantizer comprising a comparator and a memory, at least one of a first quantization operation to generate a first digital output or a second quantization operation to generate a second digital output; and
outputting, by the quantizer and based on a range of an intensity of the incident light, one of the first digital output or the second digital output to represent the intensity of the incident light,
wherein the first quantization operation comprises comparing, using the comparator, a first voltage representing at least a first part of the charge during the exposure period against one or more threshold voltages to generate one or more first comparison results, and storing the first digital output in the memory based on the one or more first comparison results; and
wherein the second quantization operation comprises comparing, using the comparator, a second voltage representing at least a second part of the charge after the exposure period against a ramping threshold voltage to generate a second comparison result, and storing the second digital output in the memory based on the second comparison result.

19. The method of claim 18, wherein the photodiode stores the second part of the charge until the photodiode saturates and outputs the first part of the charge after the photodiode saturates.

20. The method of claim 18, wherein the first quantization operation comprises determining a time when the first voltage intersects with a threshold voltage of the one or more threshold voltages, and generating the first digital output based on the time; and
wherein the second quantization operation comprises measuring a quantity of the second part of the charge.

* * * * *